US009806070B2

(12) United States Patent
Liaw

(10) Patent No.: US 9,806,070 B2
(45) Date of Patent: Oct. 31, 2017

(54) SEMICONDUCTOR DEVICE LAYOUT, MEMORY DEVICE LAYOUT, AND METHOD OF MANUFACTURING SEMICONDUCTOR DEVICE

(71) Applicant: TAIWAN SEMICONDUCTOR MANUFACTURING COMPANY, LTD., Hsinchu (TW)

(72) Inventor: Jhon Jhy Liaw, Zhudong Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 77 days.

(21) Appl. No.: 14/598,268

(22) Filed: Jan. 16, 2015

(65) Prior Publication Data

US 2016/0211251 A1     Jul. 21, 2016

(51) Int. Cl.
| | | |
|---|---|---|
| H01L 27/02 | (2006.01) | |
| H01L 27/088 | (2006.01) | |
| H01L 29/423 | (2006.01) | |
| H01L 27/11 | (2006.01) | |
| H01L 21/311 | (2006.01) | |
| H01L 21/768 | (2006.01) | |
| H01L 21/8234 | (2006.01) | |

(52) U.S. Cl.
CPC .... *H01L 27/0207* (2013.01); *H01L 21/31144* (2013.01); *H01L 21/76895* (2013.01); *H01L 21/76897* (2013.01); *H01L 27/088* (2013.01); *H01L 27/1104* (2013.01); *H01L 29/42364* (2013.01); *H01L 21/823475* (2013.01); *H01L 2924/0002* (2013.01)

(58) Field of Classification Search
CPC ............... H01L 27/0207; H01L 27/088; H01L 29/42364; H01L 27/1104; H01L 21/31144; H01L 21/76802; H01L 21/76877; H01L 2924/002
See application file for complete search history.

(56) References Cited

U.S. PATENT DOCUMENTS

| | | | |
|---|---|---|---|
| 8,421,205 | B2 | 4/2013 | Yang |
| 8,661,389 | B2 | 2/2014 | Chern et al. |
| 8,698,205 | B2 | 4/2014 | Tzeng et al. |
| 8,826,212 | B2 | 9/2014 | Yeh et al. |

(Continued)

*Primary Examiner* — Stephen W Smoot
*Assistant Examiner* — Sun M King
(74) *Attorney, Agent, or Firm* — Hauptman Ham, LLP

(57) ABSTRACT

A layout of a semiconductor device includes active area regions, gate electrodes crossing the plurality of active area regions, spacers along sides of the corresponding plurality of gate electrodes, a first contact patterning region, a second contact patterning region, and a contact area. The first contact patterning region overlaps at least one active area region among the plurality of active area regions, at least one gate electrode among the plurality of gate electrodes, and at least one spacer among the plurality of spacers, the at least one spacer corresponding to the at least one gate electrode. The second contact patterning region overlaps a portion of the first contact patterning region. The contact area overlaps the at least one active area region. A boundary of the contact area is defined by boundaries of the first contact patterning region, the second contact patterning region and the at least one spacer.

20 Claims, 25 Drawing Sheets

(56) References Cited

U.S. PATENT DOCUMENTS

| | | |
|---|---|---|
| 8,836,141 B2 | 9/2014 | Chi et al. |
| 2003/0168686 A1* | 9/2003 | Hayashi ............ H01L 27/10894 257/296 |
| 2011/0068400 A1* | 3/2011 | Wang .................. H01L 27/1104 257/347 |
| 2014/0153322 A1* | 6/2014 | Liaw ................... H01L 27/1108 365/156 |
| 2014/0215420 A1 | 7/2014 | Lin et al. |
| 2014/0264924 A1 | 9/2014 | Yu et al. |
| 2014/0282289 A1 | 9/2014 | Hsu et al. |
| 2014/0325466 A1 | 10/2014 | Ke et al. |

\* cited by examiner

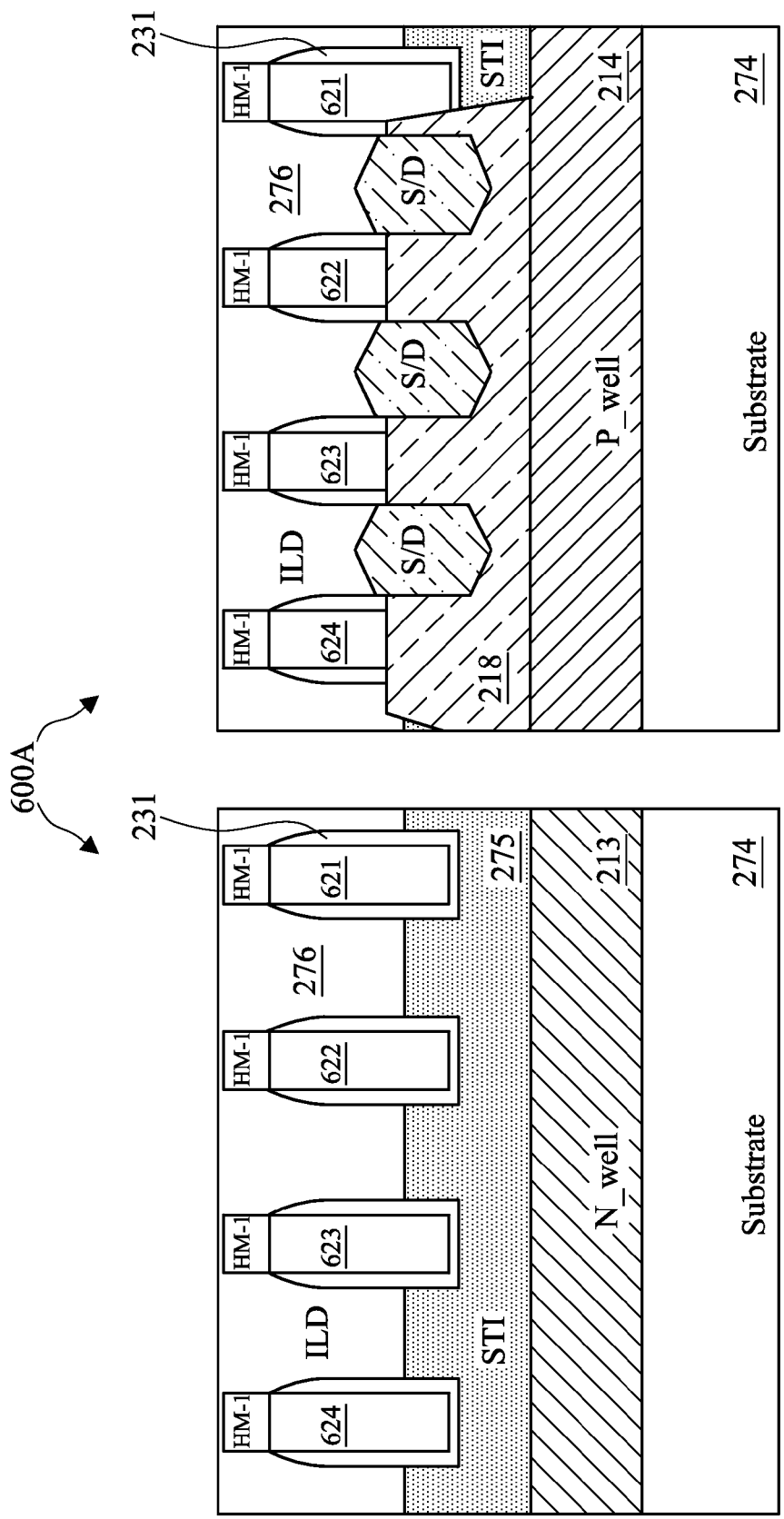
Fig. 6A-II
Fig. 6A-I

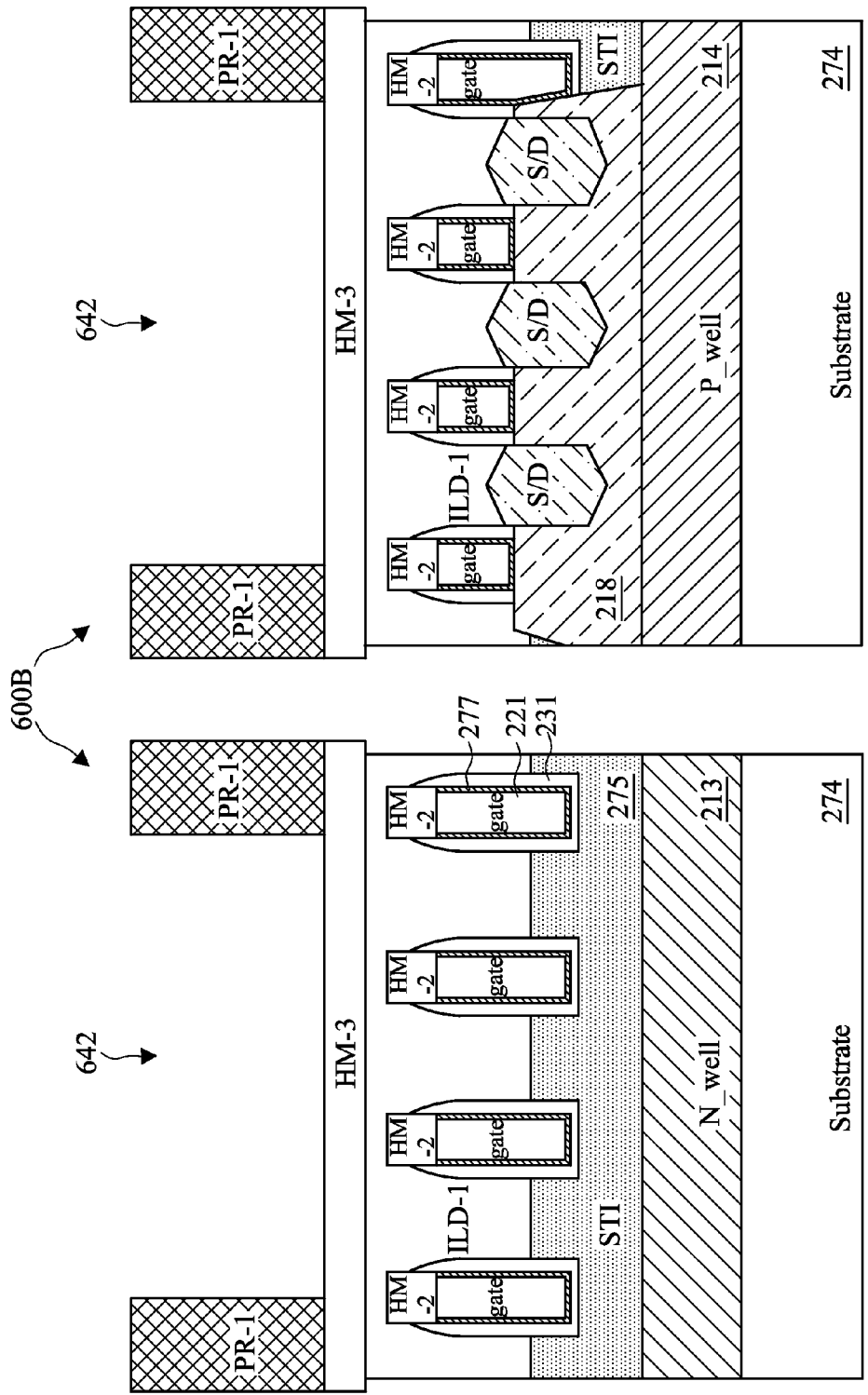
Fig. 6B-I
Fig. 6B-II

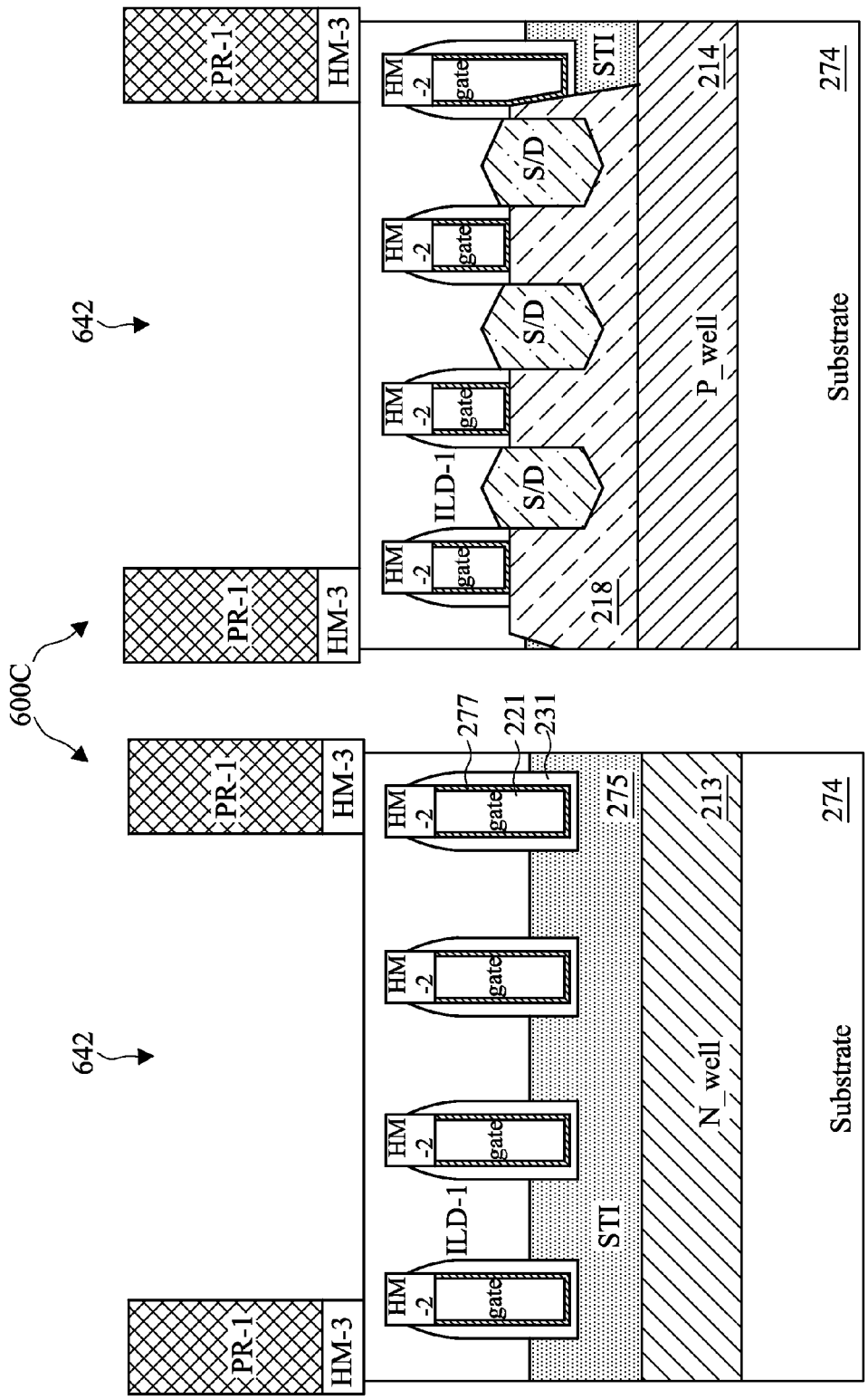

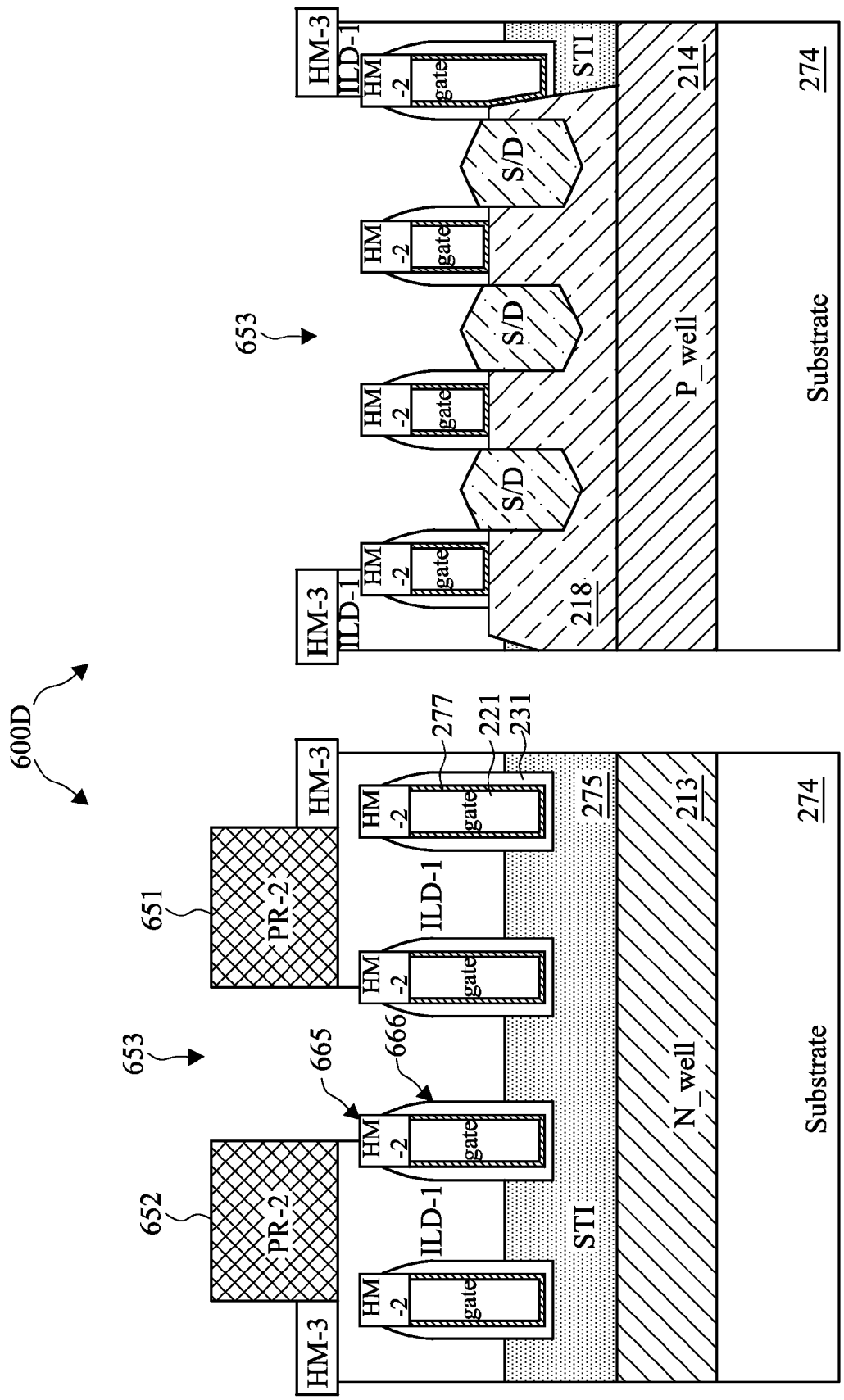
Fig. 6D-I
Fig. 6D-II

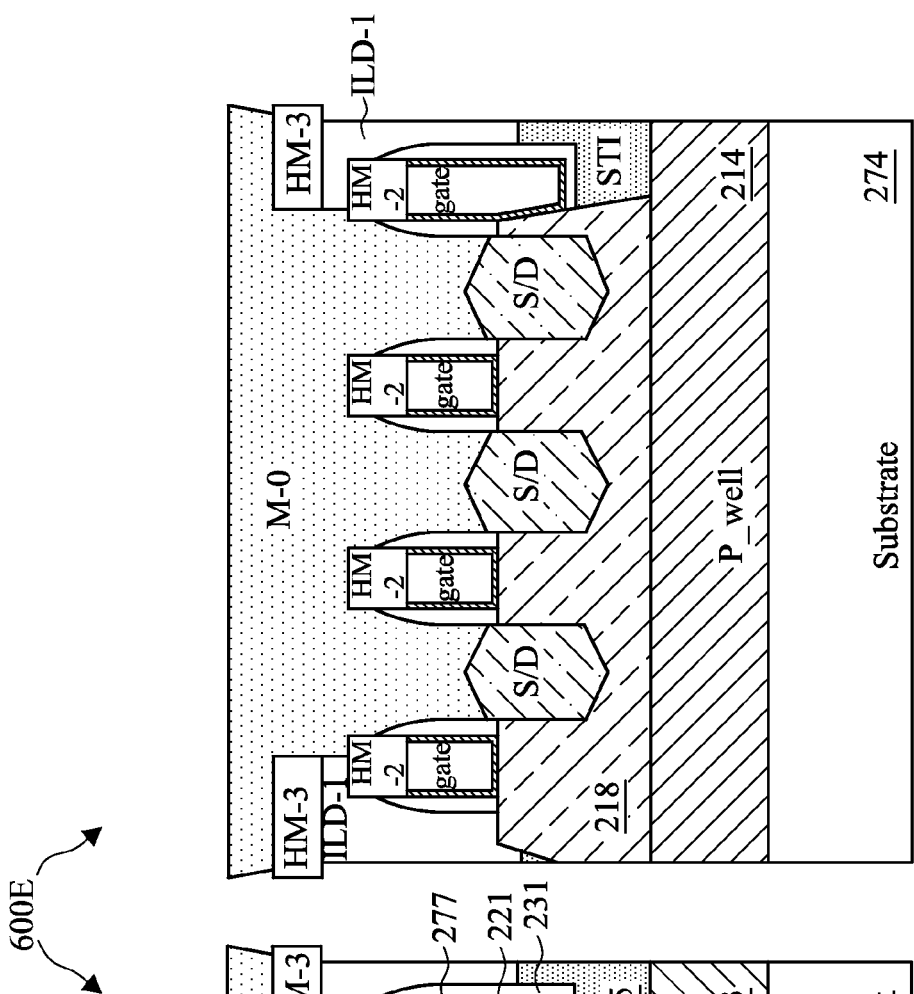
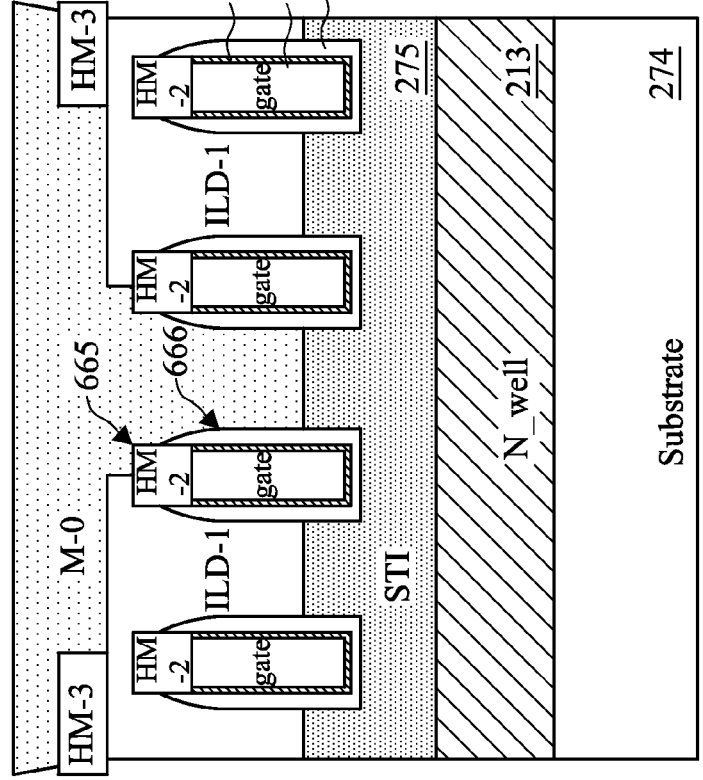
Fig. 6E-II
Fig. 6E-I

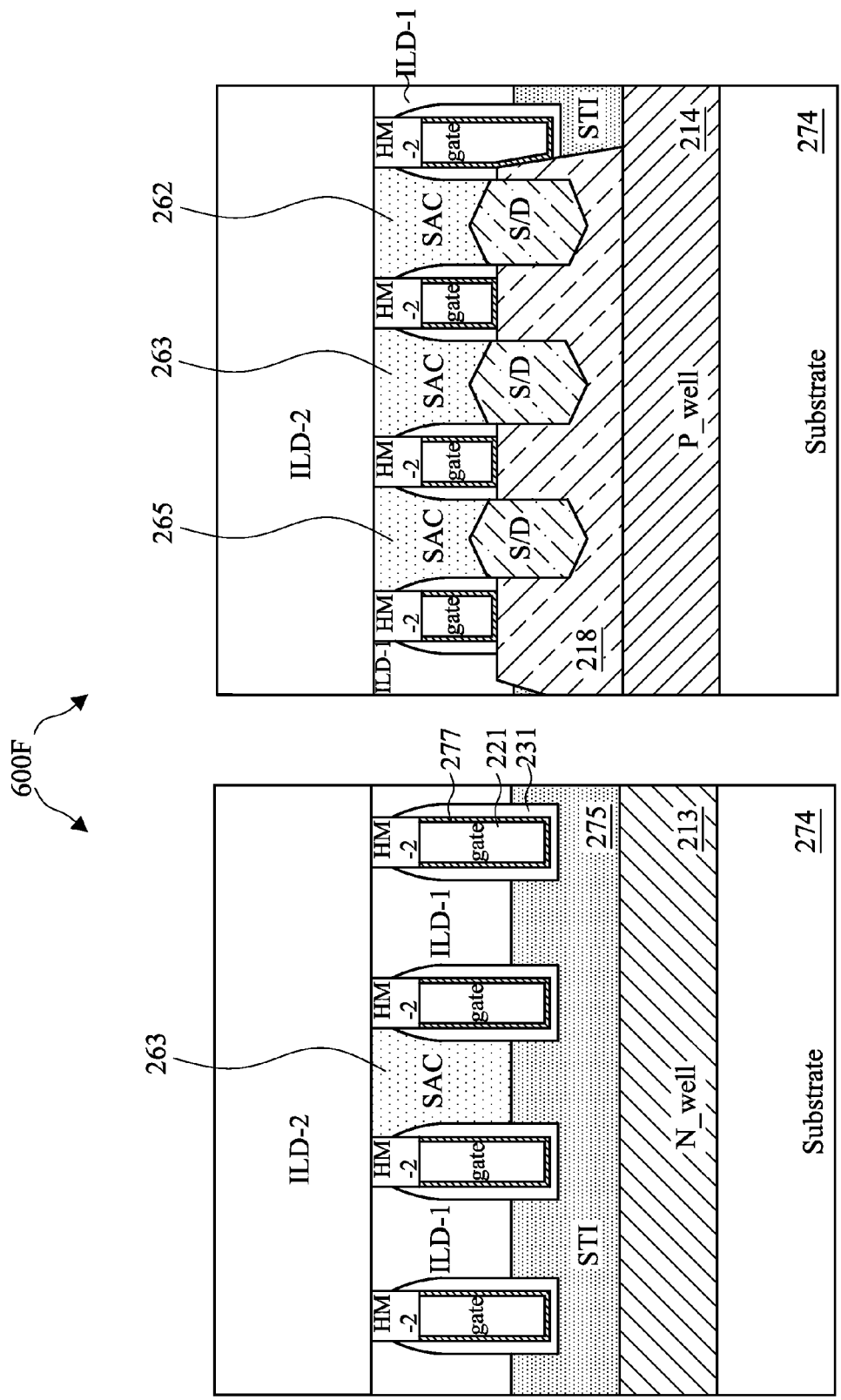

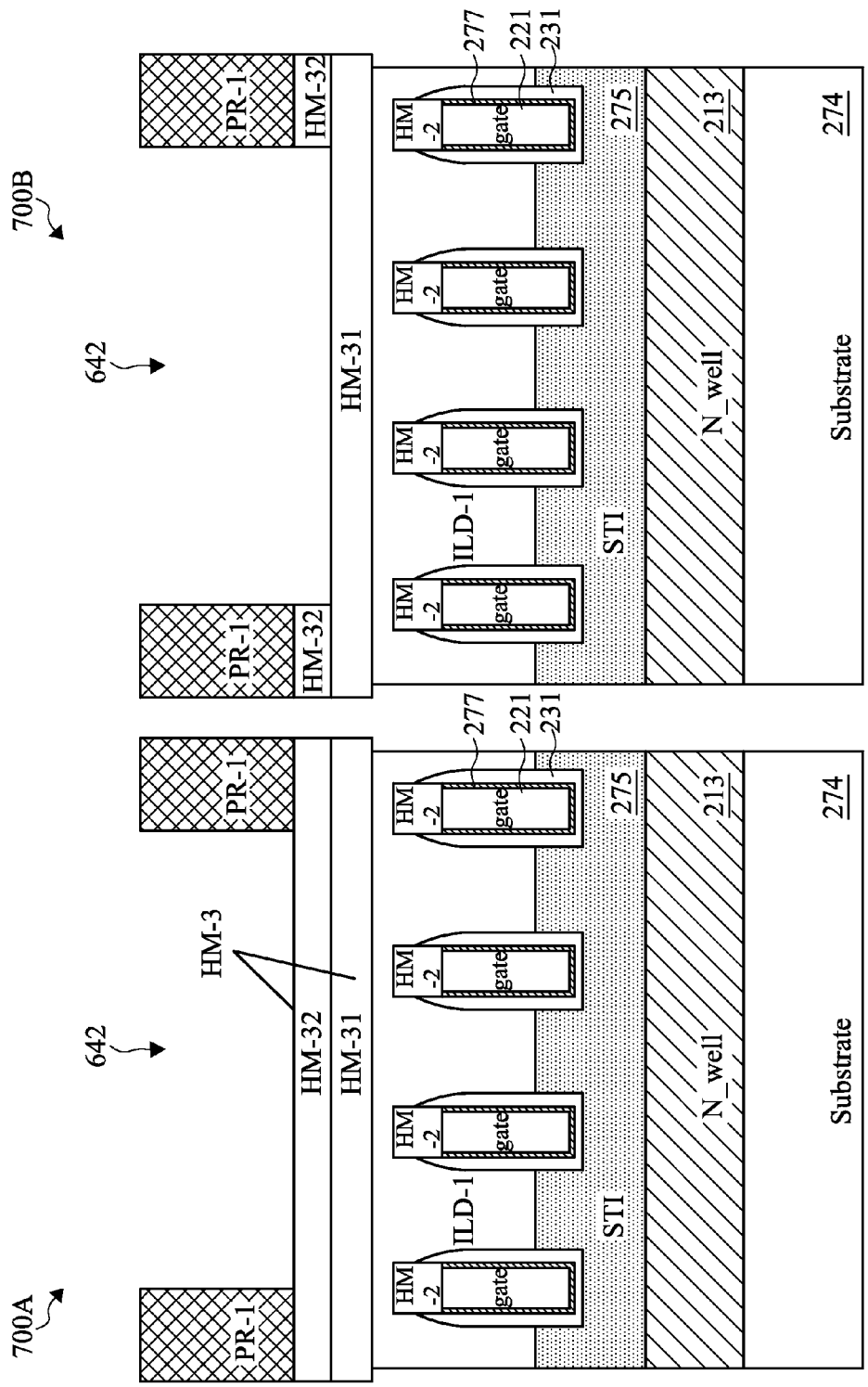

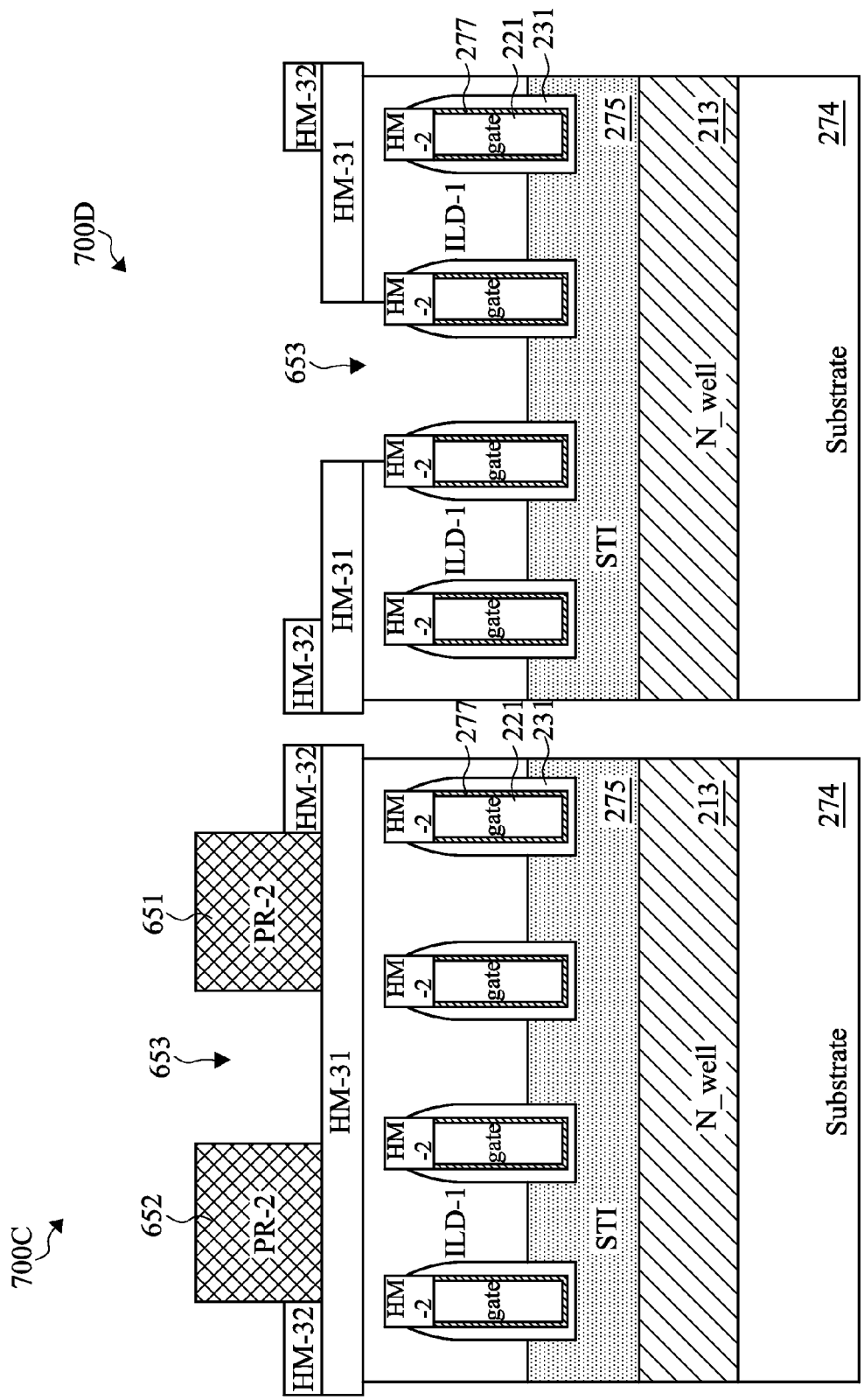

SEMICONDUCTOR DEVICE LAYOUT, MEMORY DEVICE LAYOUT, AND METHOD OF MANUFACTURING SEMICONDUCTOR DEVICE

BACKGROUND

The recent trend in miniaturizing integrated circuits (ICs) has resulted in smaller devices which consume less power, yet provide more functionality at higher speeds than before. The miniaturization process has also resulted in various developments in IC designs and/or manufacturing processes to ensure production yield and intended performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A-I~6F-I are cross-section views of a semiconductor device taken along line I-I' in FIG. 2C, and FIGS. 6A-II~6F-II are cross-section views of the semiconductor device taken along line II-II' in FIG. 2C, at various manufacturing stages of the semiconductor device, in accordance with some embodiments.

FIGS. 7A~7F are cross-section views of a semiconductor device taken along line I-I' in FIG. 2C, at various manufacturing stages of the semiconductor device, in accordance with some embodiments.

DETAILED DESCRIPTION

Figure 1B:
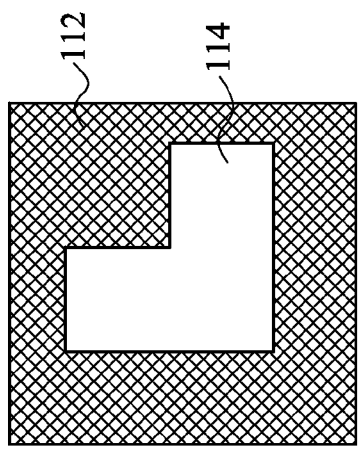
FIG. 1B is a top view of a photoresist layer patterned by using the first mask of FIG. 1A, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, when a first element is described as being "connected" or "coupled" to a second element, such description includes embodiments in which the first and second elements are directly connected or coupled to each other, and also includes embodiments in which the first and second elements are indirectly connected or coupled to each other with one or more other intervening elements in between.

Some embodiments provide a patterning technique for forming contact areas over active area regions. The contact areas have boundaries defined by boundaries of a first contact patterning region (such as a clear tone patterning region), a second contact patterning region (such as a dark tone patterning region), and one or more spacers. As a result, the contact areas are self-aligned and fill the spaces between adjacent spacers.

Figure 1D:
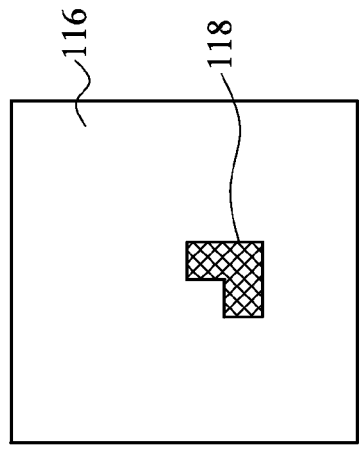
FIG. 1D is a top view of a photoresist layer patterned by using the second mask of FIG. 1C, in accordance with some embodiments.
Figure 1A:
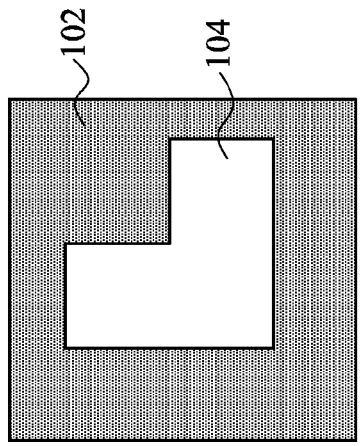
FIG. 1A is a top view of a first mask used for forming a photoresist layer, in accordance with some embodiments.

FIG. 1A is a top view of a first mask 100A used for forming a photoresist layer, in accordance with some embodiments. The first mask 100A comprises a darker region 102 and a lighter region 104. The darker region 102 extends around the lighter region 104. The lighter region 104 allows light to pass through and corresponds to a pattern of an intended shape to be formed in a layer of a semiconductor device. In at least one embodiment, the lighter region 104 is referred to as a clear tone pattern, and the first mask 100A is referred to as a clear tone mask.

FIG. 1B is a top view of a photoresist layer 100B patterned by using the first mask 100A, in accordance with some embodiments. When the first mask 100A is used for patterning a photoresist, the lighter region 104 allows light, such as ultra-violet (UV) light, to pass through. As a result, a portion of the photoresist corresponding to the lighter region 104 is exposed to the light, and another portion of the photoresist corresponding to the darker region 102 is not exposed to the light. In at least one embodiment, the photoresist is a positive photoresist. The exposed portion of the positive photoresist becomes soluble in a developing solution, whereas the unexposed portion of the positive photoresist remains insoluble in the developing solution. When the developing solution is applied, the exposed portion of the positive photoresist is removed, and the unexposed portion of the positive photoresist remains to obtain a patterned photoresist layer 100B. The patterned photoresist layer 100B comprises a region 112 of remaining photoresist corresponding to the darker region 102 of the first mask 100A. The patterned photoresist layer 100B further comprises an opening 114 from which photoresist has been removed and which corresponds to the lighter region 104 of the first mask 100A. When the patterned photoresist layer 100B is used as a mask for patterning a layer of a semiconductor device, an opening corresponding to the opening 114 and the lighter region (or clear tone pattern) 104 of the first mask (or clear tone mask) 100A is formed in the layer of the semiconductor device.

Figure 1C:
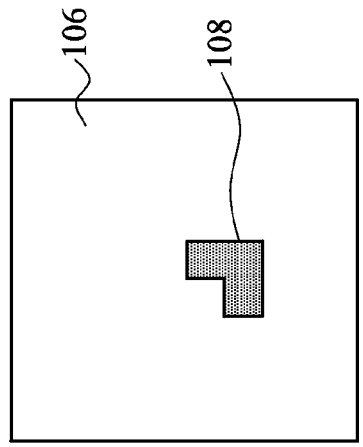
FIG. 1C is a top view of a second mask used for forming a photoresist layer, in accordance with some embodiments.

FIG. 1C is a top view of a second mask 100C used for forming a photoresist layer, in accordance with some embodiments. The second mask 100C comprises a lighter region 106 and a darker region 108. The lighter region 106 extends around the darker region 108. The darker region 108 blocks light and corresponds to a pattern of an intended shape to be formed in a layer of a semiconductor device. In at least one embodiment, the darker region 108 is referred to as a dark tone pattern, and the second mask 100C is referred to as a dark tone mask.

FIG. 1D is a top view of a photoresist layer 100D patterned by using the second mask 100C, in accordance with some embodiments. When the second mask 100C is used for patterning a photoresist, the lighter region 106 allows light to pass through. As a result, a portion of the photoresist corresponding to the lighter region 106 is exposed to the light, and another portion of the photoresist corresponding to the darker region 108 is not exposed to the light. In at least one embodiment, the photoresist is a positive photoresist. When a developing solution is applied, a patterned photoresist layer 100D is obtained. In the patterned photoresist layer 100D, the exposed photoresist is removed from a region 116 corresponding to the lighter region 106, leaving a photoresist block 118 corresponding to the darker region 108 of the second mask 100C. When the patterned photoresist layer 100D is used as a mask for patterning a layer of a semiconductor device, a material of such a layer is removed from a region corresponding to the region 116, leaving a pattern of the material under the photoresist block 118 and corresponding to the darker region (or dark tone pattern) 108 of the second mask (or dark tone mask) 100C.

Figure 1E:
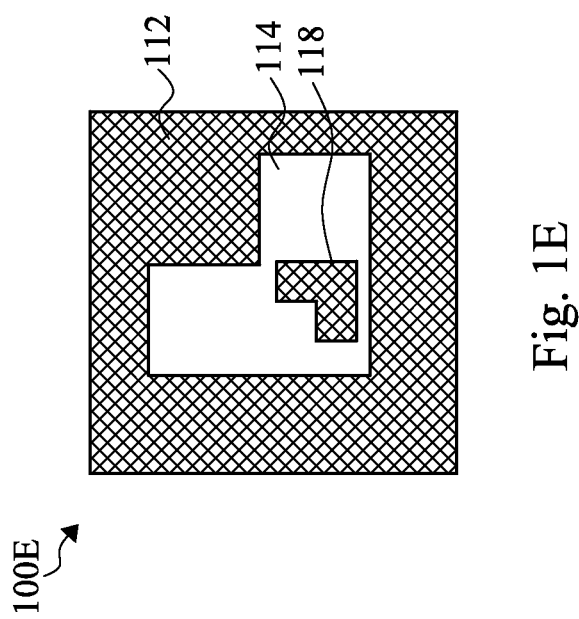
FIG. 1E is a top view of a layer patterned by using the first mask of FIG. 1A and the second mask of FIG. 1C, in accordance with some embodiments.

FIG. 1E is a top view of a layer 100E patterned by using the first mask of FIG. 1A in a first patterning process, and then using the second mask of FIG. 1C in a second, subsequent patterning process, in accordance with some embodiments. The patterned layer 100E comprises a material pattern 118 which overlaps or covers a portion of the an opening 114 surrounded by a material region 112.

The formation of an opening of an intended shape as described with respect to FIGS. 1A-1B, or a material pattern of an intended shape as described with respect to FIGS. 1C-1D is an example. Other arrangements are within the scope of various embodiments. For example, in at least one embodiment, when the photoresist is a negative photoresist, an opening of an intended shape is formed with a dark tone mask, and/or a material pattern of an intended shape is formed with a clear tone mask.

Figure 2:
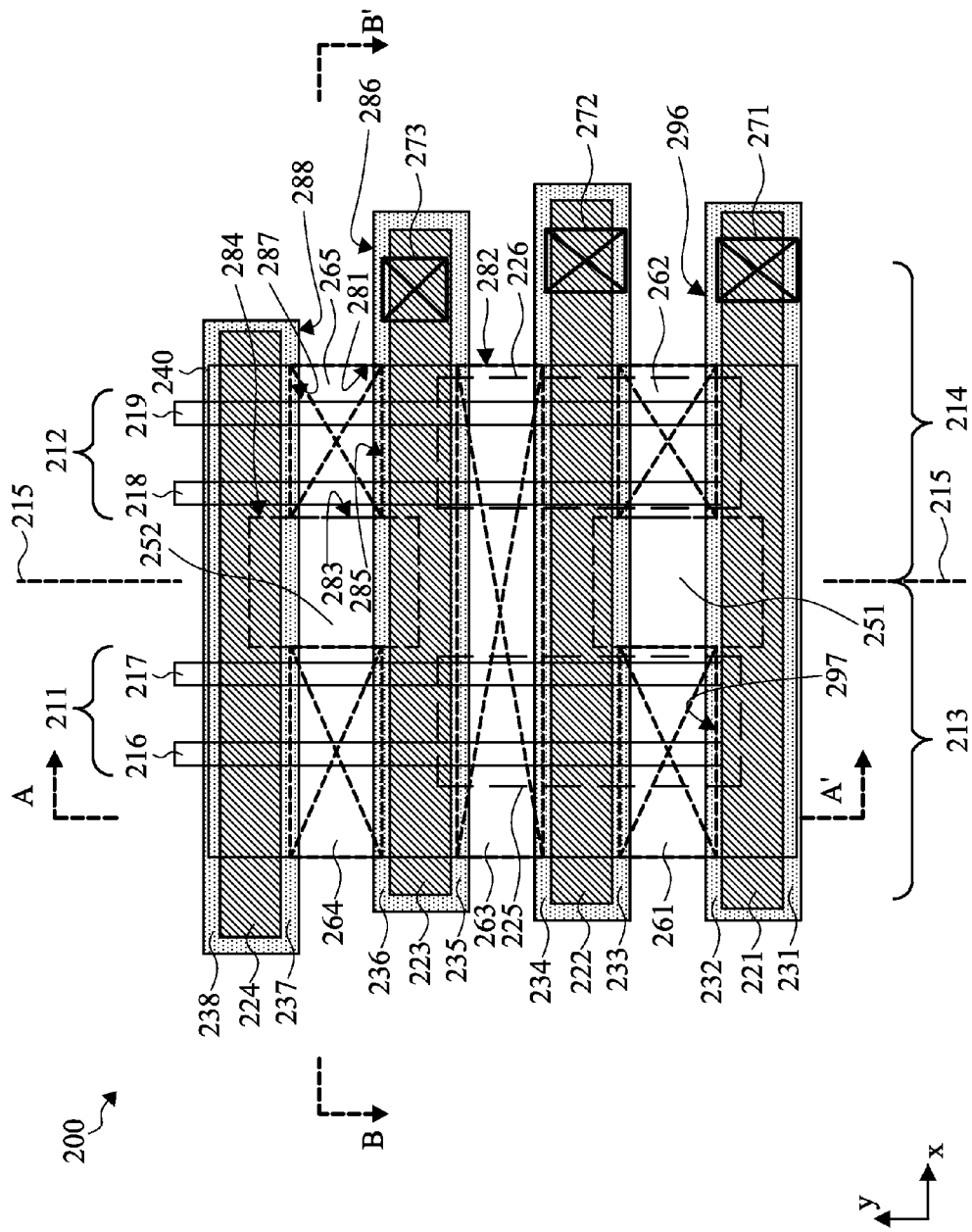
FIG. 2 is a top view of a layout of a semiconductor device, in accordance with some embodiments.

FIG. 2 is a top view of a layout 200 of a semiconductor device, in accordance with some embodiments. The layout 200 comprises a plurality of active area regions 211, 212, a plurality of gate electrodes 221, 222, 223, 224, a plurality of spacers 231, 232, 233, 234, 235, 236, 237, 238, a first contact patterning region 240, second contact patterning regions 251, 252, and contact areas 261, 262, 263, 264, 265.

The active area regions 211, 212 extend along a first direction of the layout 200, e.g., the Y direction. In some embodiments, the active area regions 211, 212 are also referred to as oxide-definition (OD) regions. Example materials of the active area regions 211, 212 include, but are not limited to, semiconductor materials doped with various types of p-dopants and/or n-dopants. In at least one embodiment, the active area regions 211, 212 include dopants of the same type. In at least one embodiment, one of the active area regions 211, 212 comprises dopants of a type different from a type of dopants of another one of the active area regions 211, 212. The active area regions 211, 212 are isolated from each other by one or more isolation structures as described herein. The active area regions 211, 212 are within corresponding well regions. For example, the active area region 211 is within a well region 213 which is an n-well region in one or more embodiments, and the active area region 212 is within a well region 214 which is a p-well region in one or more embodiments. The described conductivity of the well regions 213, 214 is an example. Other arrangements are within the scope of various embodiments. The n-well region 213 and the p-well region 214 are on opposite side of an imaginary line 215 which divides the semiconductor device into separate regions for different types of devices or transistors. Examples of transistors include, but are not limited to, metal oxide semiconductor field effect transistors (MOS-FET), complementary metal oxide semiconductor (CMOS) transistors, bipolar junction transistors (BJT), high voltage transistors, high frequency transistors, p-channel and/or n-channel field effect transistors (PFETs/NFETs), FinFETs, planar MOS transistors with raised source/drains, or the like. In the example configuration in FIG. 2, the n-well region 213 is a region for forming p-channel metal-oxide semiconductor (PMOS) transistors, and the p-well region 214 is a region for forming n-channel metal-oxide semiconductor (NMOS) transistors. Each of the active area regions 211, 212 comprises one or more fins to form FinFETs. For example, the active area region 211 comprises two fins 216, 217, and the active area region 212 comprises two fins 218, 219. The fins 216, 217, 218, 219 are isolated from each other by one or more isolation structures as described herein. Other numbers of fins in each of the active area regions 211, 212 are within the scope of various embodiments. The described FinFET configuration is an example. Other arrangements are within the scope of various embodiments. For example, in one or more embodiments, the active area regions 211, 212 do not include fins and are configured for forming planar MOSFET transistors.

The gate electrodes 221, 222, 223, 224 extend along a second direction of the layout 200, e.g., the X direction, across the active area regions 211, 212. Example materials of the gate electrodes 221, 222, 223, 224 include, but are not limited to, polysilicon and metal. Other materials are within the scope of various embodiments. The gate electrodes 221, 222, 223, 224 and the corresponding active area regions 211, 212 form one or more transistors in the layout 200. For example, in the example configuration in FIG. 2, a transistor 225 is formed by the gate electrode 222 and the active area region 211. A gate of the transistor 225 is formed by the gate electrode 222. One of a drain or a source (referred to herein as "source/drain") of the transistor 225 is defined by a region of the active area region 211 on one side (e.g., the upper side in FIG. 2) of the gate electrode 222. The other source/drain of the transistor 225 is defined by another region of the active area region 211 on the opposite side (e.g., the lower side in FIG. 2) of the gate electrode 222. For another example, a further transistor 226 is formed by the gate electrode 222 and the active area region 212. In at least one embodiment, further transistors are formed by the gate electrode 223 and the corresponding active area regions 211, 212. One or more of the gate electrodes 221, 222, 223, 224 are coupled to other circuitry of the semiconductor device by corresponding gate contacts. For example, gate contacts 271, 272, 273 are configured on the corresponding gate electrodes 221, 222, 223 for coupling the corresponding gate electrodes 221, 222, 223 to other circuitry. In at least one embodiment, the gate electrode 224 is a dummy gate electrode which is not configured to be electrically coupled to other circuitry. In at least one embodiment, the gate electrode 221 is also a dummy gate electrode.

The spacers 231, 232, 233, 234, 235, 236, 237, 238 are arranged along sides of the corresponding plurality of gate electrodes. For example, the spacers 231, 232 are arranged along longitudinal sides of the gate electrode 221 in the X direction, the spacers 233, 234 are arranged along longitudinal sides of the gate electrode 222, the spacers 235, 236 are arranged along longitudinal sides of the gate electrode 223, and the spacers 237, 238 are arranged along longitudinal sides of the gate electrode 224. The spacers 231, 232, 233, 234, 235, 236, 237, 238 include one or more dielectric materials for electrically isolating the corresponding gate electrodes from unintended electrical contact. Example dielectric materials of the spacers include, but are not limited to, silicon nitride, oxynitride and silicon carbide. In at least one embodiment, one or more of the spacers 231, 232, 233, 234, 235, 236, 237, 238 have a tapered profile as described herein.

The first contact patterning region 240 covers at least one active area region among the active area regions 211, 212, at least one gate electrode among the gate electrodes 221, 222, 223, 224, and at least one spacer among spacers 231, 232, 233, 234, 235, 236, 237, 238 that corresponds to the at least one gate electrode. For example, the first contact patterning region 240 covers the active area regions 211, 212, the gate electrodes 221, 222, 223, 224 and the spacers 231, 232, 233, 234, 235, 236, 237, 238 corresponding to the gate electrodes 221, 222, 223, 224 covered by the first contact patterning region 240. In the example configuration in FIG. 2, first contact patterning region 240 covers a full width (in the Y direction) of each of the gate electrodes 221, 222, 223, 224 and all spacers 231, 232, 233, 234, 235, 236, 237, 238 associated with the gate electrodes 221, 222, 223, 224. Other arrangements are within the scope of various embodiments. For example, as shown in FIG. 2C, which is a top view of a layout 200C of a semiconductor device in accordance with some embodiments, a first contact patterning region 242 does not cover the full width of the gate electrode 221 and the gate electrode 224, and does not cover the spacers 231 and 238.

Each of the second contact patterning regions 251, 252 covers or overlaps a portion of the first contact patterning region 240. For example, the second contact patterning region 251 overlaps a portion of the first contact patterning region 240 over an isolation structure between the gate electrodes 221, 222 and between the active area regions 211, 212. The second contact patterning region 252 overlaps a portion of the first contact patterning region 240 over another isolation structure between the gate electrodes 223, 224 and between the active area regions 211, 212. In the example configuration in FIG. 2, the second contact patterning regions 251, 252 have boundaries located completely within the boundary of the first contact patterning region 240. Other arrangements are within the scope of various embodiments. For example, in the layout 200C in FIG. 2C, a lower edge of the second contact patterning region 251 coincides with a lower edge of the first contact patterning region 240, and an upper edge of the second contact patterning region 252 coincides with an upper edge of the first contact patterning region 240. In other example embodiments as described herein, one or more of the second contact patterning regions 251, 252 extend(s) across one or more edges of the first contact patterning region 240. The described number, i.e., two, of the second contact patterning regions overlapping the first contact patterning region 240 is an example. Other numbers of second contact patterning regions overlapping a first contact patterning region are within the scope of various embodiments. For example, in at least one embodiment, one of the second contact patterning regions 251, 252 is omitted. The rectangular shapes of the first contact patterning region 240 and second contact patterning regions 251, 252 are examples. Other shapes of the first contact patterning region 240 and/or the second contact patterning regions 251, 252 are within the scope of various embodiments.

In some embodiments, the first contact patterning region 240 and the second contact patterning regions 251, 252 are configured to pattern sacrificial layers. Such patterned sacrificial layers are used to pattern contact areas as described herein, and then removed by one or more subsequent processes during manufacture of the semiconductor device. Example sacrificial layers include, but are not limited to, photoresist layers and hard mask layers. In some embodiments, the first contact patterning region 240 is configured to form an opening in a sacrificial layer, as described with respect to FIGS. 1A-1B. In at least one embodiment, the first contact patterning region 240 corresponds to a clear tone pattern on a clear tone mask as described with respect to FIG. 1A. In some embodiments, the second contact patterning regions 251, 252 are configured to form corresponding patterns of sacrificial material in a sacrificial layer, as described with respect to FIGS. 1C-1D. In at least one embodiment, the second contact patterning regions 251, 252 correspond to dark tone patterns on a dark tone mask as described with respect to FIG. 1C. In some embodiments, a first patterning process is performed to form an opening having a shape of the first contact patterning region 240 in a sacrificial layer, and a second patterning process is subsequently performed to form material patterns or blocks having shapes of the second contact patterning regions 251, 252 and overlapping or covering corresponding portions of the opening, as described with respect to FIG. 1E.

The contact areas 261, 262, 263, 264, 265 overlap the corresponding active area regions 211, 212. For example, the contact areas 261, 263, 264 overlap the active area region 211, and the contact areas 262, 263, 265 overlap the active area region 212. The contact areas 261, 262, 263, 264, 265 are configured to electrically couple the underlying source/drains of the corresponding transistors with each other or with other circuitry of the semiconductor device. For example, the contact areas 261, 262, 264, 265 are configured to electrically couple the underlying source/drains of the corresponding transistors with other circuitry of the semiconductor device, whereas the contact area 263 is configured to electrically couple the underlying source/drains of the corresponding transistors 225, 226.

Boundaries of the contact areas 261, 262, 264, 265 are defined by boundaries of the first contact patterning region 240, second contact patterning regions 251, 252, and one or more of the spacers 232, 233, 234, 235, 236, 237. In the example configuration in FIG. 2, the boundary of the contact area 265 is defined by the boundary of the first contact patterning region 240, the boundary of the second contact patterning region 252, and the boundaries of the spacers 236, 237. For example, a right edge 281 of the contact area 265 corresponds to a right edge 282 of the first contact patterning region 240, a left edge 283 of the contact area 265 corresponds to a right edge 284 of the second contact patterning region 252, a lower edge 285 of the contact area 265 corresponds to an upper edge 286 of the spacer 236, and an upper edge 287 of the contact area 265 corresponds to a lower edge 288 of the spacer 237. The right edge 281 and the left edge 283 of the contact area 265 are illustrated as coinciding with the corresponding right edge 282 of the first contact patterning region 240 and the corresponding right edge 284 of the second contact patterning region 252. The lower edge 285 and the upper edge 287 of the contact area 265 are illustrated as not coinciding with the corresponding upper edge 286 of the spacer 236 and lower edge 288 of the spacer 237, because the spacers 236 and 237 have a tapered profile as described herein. In at least one embodiment, the boundary of the contact area 265 is further defined by the boundary of at least one of the gate electrode 223 corresponding to the spacer 236 or the gate electrode 224 corresponding to the spacer 237, as described herein with respect to FIGS. 5A-5B.

The boundary of the contact area 264 is defined by the boundary of the first contact patterning region 240, the boundary of the second contact patterning region 252, and the boundaries of the spacers 236, 237. For example, a right edge of the contact area 264 corresponds to a left edge of the second contact patterning region 252, a left edge of the contact area 264 corresponds to a left edge 284 of the first contact patterning region 240, a lower edge of the contact area 264 corresponds to the upper edge 286 of the spacer 236, and an upper edge of the contact area 264 corresponds to the lower edge 288 of the spacer 237. The boundaries of the contact areas 261, 262 are defined by the boundary of the first contact patterning region 240, the boundary of the second contact patterning region 252, and the boundaries of the spacers 232, 233 in manner similar to that described with respect to the contact areas 264, 265.

The boundary of the contact area 263 is defined by the boundary of the first contact patterning region 240, and the boundaries of the spacers 234, 235. For example, a right edge of the contact area 263 corresponds to the right edge 282 of the first contact patterning region 240, a left edge of the contact area 263 corresponds to the left edge of the first contact patterning region 240, a lower edge of the contact area 263 corresponds to an upper edge of the spacer 234, and an upper edge of the contact area 263 corresponds to a lower edge 288 of the spacer 235. In at least one embodiment, the boundary of at least one of the contact areas 261, 262, 223, 264 is further defined by the boundary of at least one of the corresponding gate electrodes, as described herein.

In some embodiments, the layout 200 is represented by a plurality of masks generated by one or more processors and/or stored in one or more non-transitory computer-readable media. Other formats for representing the layout 200 are within the scope of various embodiments. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like. For example, the layout 200 is presented by at least one first mask corresponding to the active area regions 211, 212, at least one second mask corresponding to the gate electrodes 221, 222, 223, 224, at least one third mask corresponding to the spacers 231, 232, 233, 234, 235, 236, 237, 238, at least one fourth mask corresponding to the first contact patterning region 240, and at least one fifth mask corresponding to the second contact patterning regions 251, 252. In one or more embodiments, the contact areas 261, 262, 263, 264, 265 are self-aligned contact areas and are defined by a combination of the other masks during manufacture of the semiconductor device. For example, in at least one embodiment, the contact areas 261, 262, 263, 264, 265 are defined by the following logic operation:

"Contact areas"="First contact patterning region"
   NOT "Second contact patterning region" NOT
   "Gate electrodes" NOT "Spacers"

where
   "Contact areas" correspond to the contact areas 261, 262, 263, 264, 265,
   "First contact patterning region" corresponds to the first contact patterning region 240,
   "Second contact patterning region" corresponds to the second contact patterning regions 251, 252,
   "Gate electrodes" correspond to gate electrodes 221, 222, 223, 224,
   "Spacers" correspond to spacers 231, 232, 233, 234, 235, 236, 237, 238, and
   NOT is the subtraction operation.

Figure 2A:
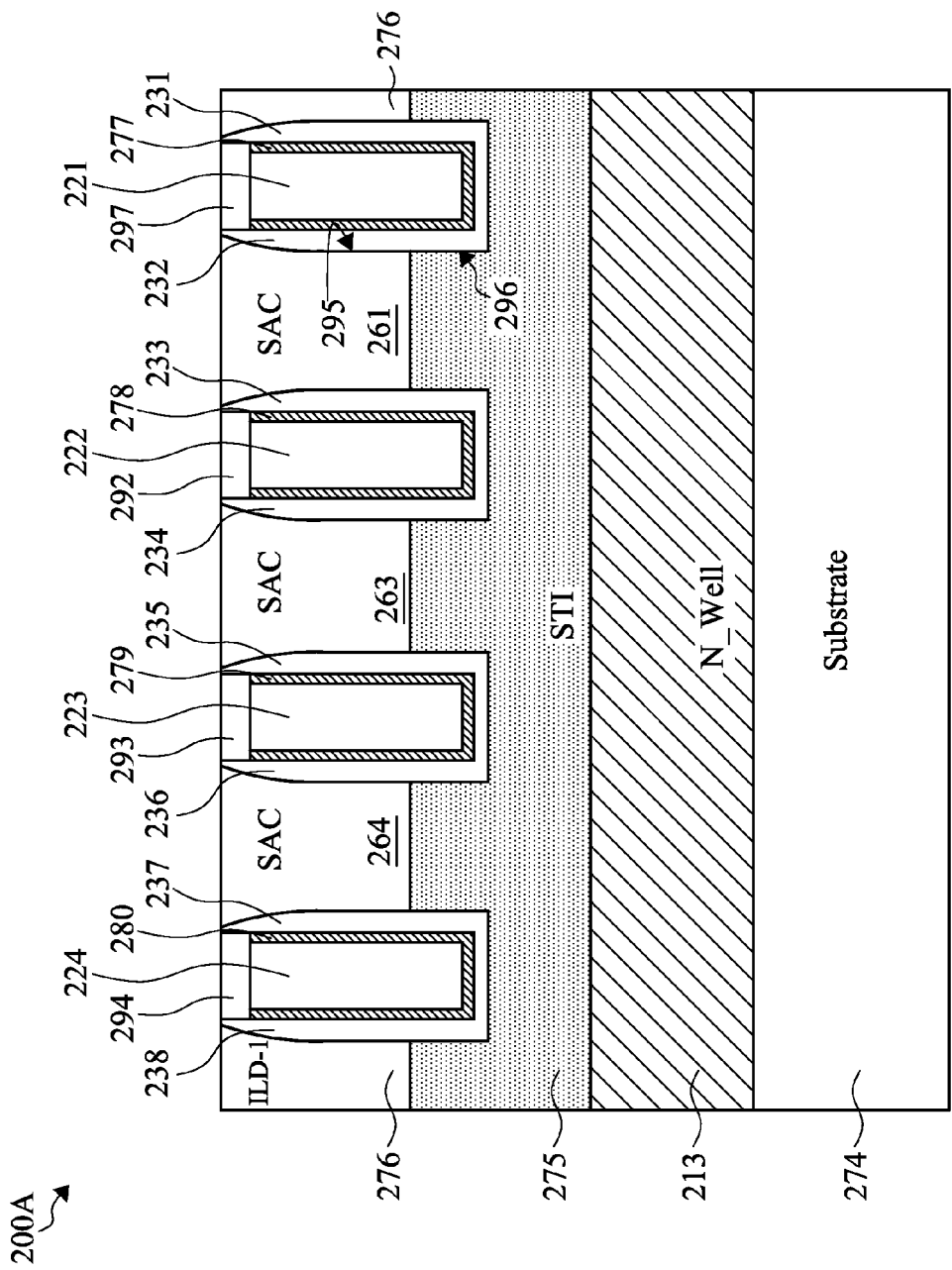
FIG. 2A is a cross-section view of a semiconductor device taken along line A-A' in FIG. 2 in accordance with some embodiments.
Figure 2B:
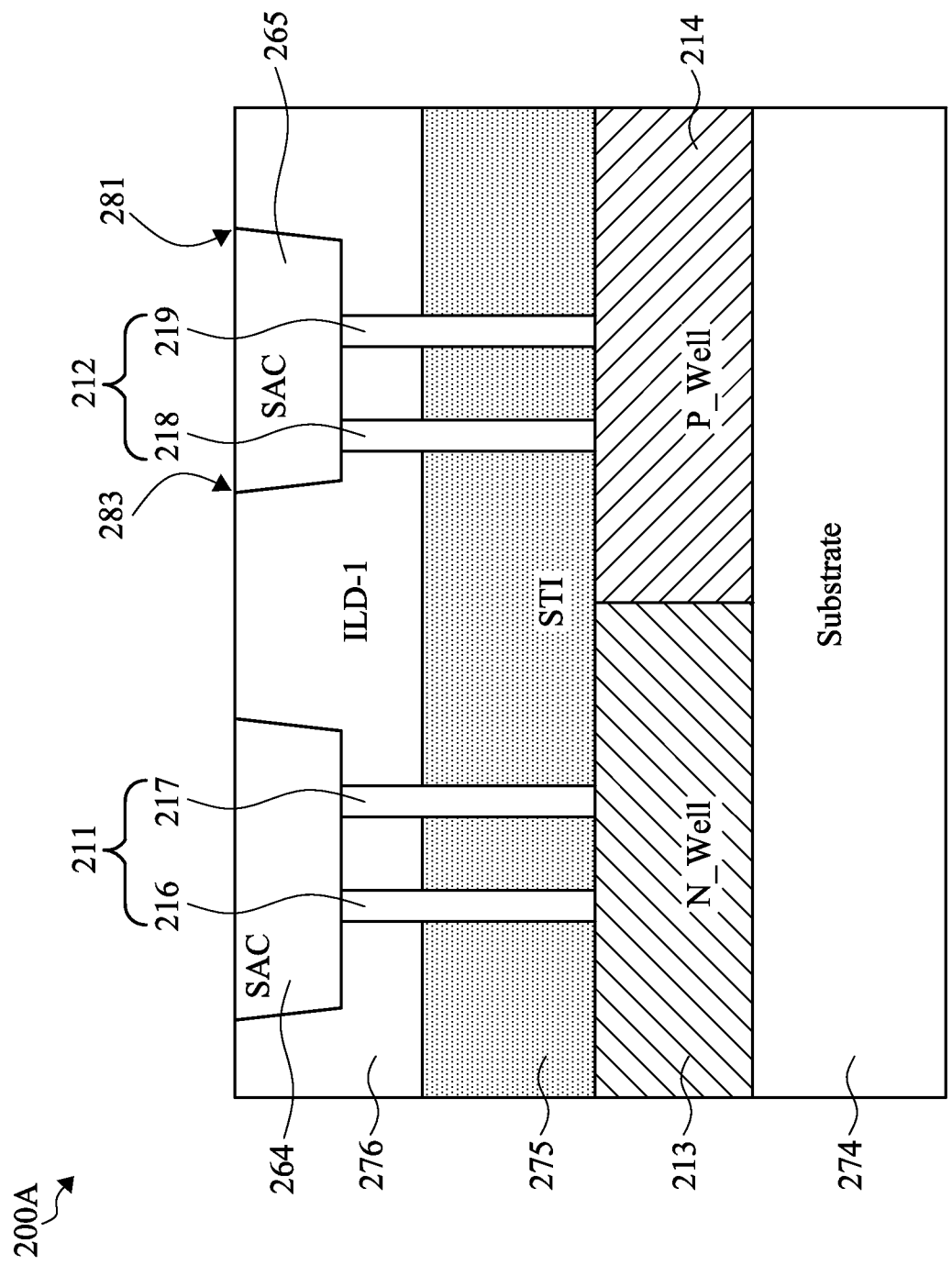
FIG. 2B is a cross-section view of the semiconductor device taken along line B-B' in FIG. 2 in accordance with some embodiments.
Figure 2C:
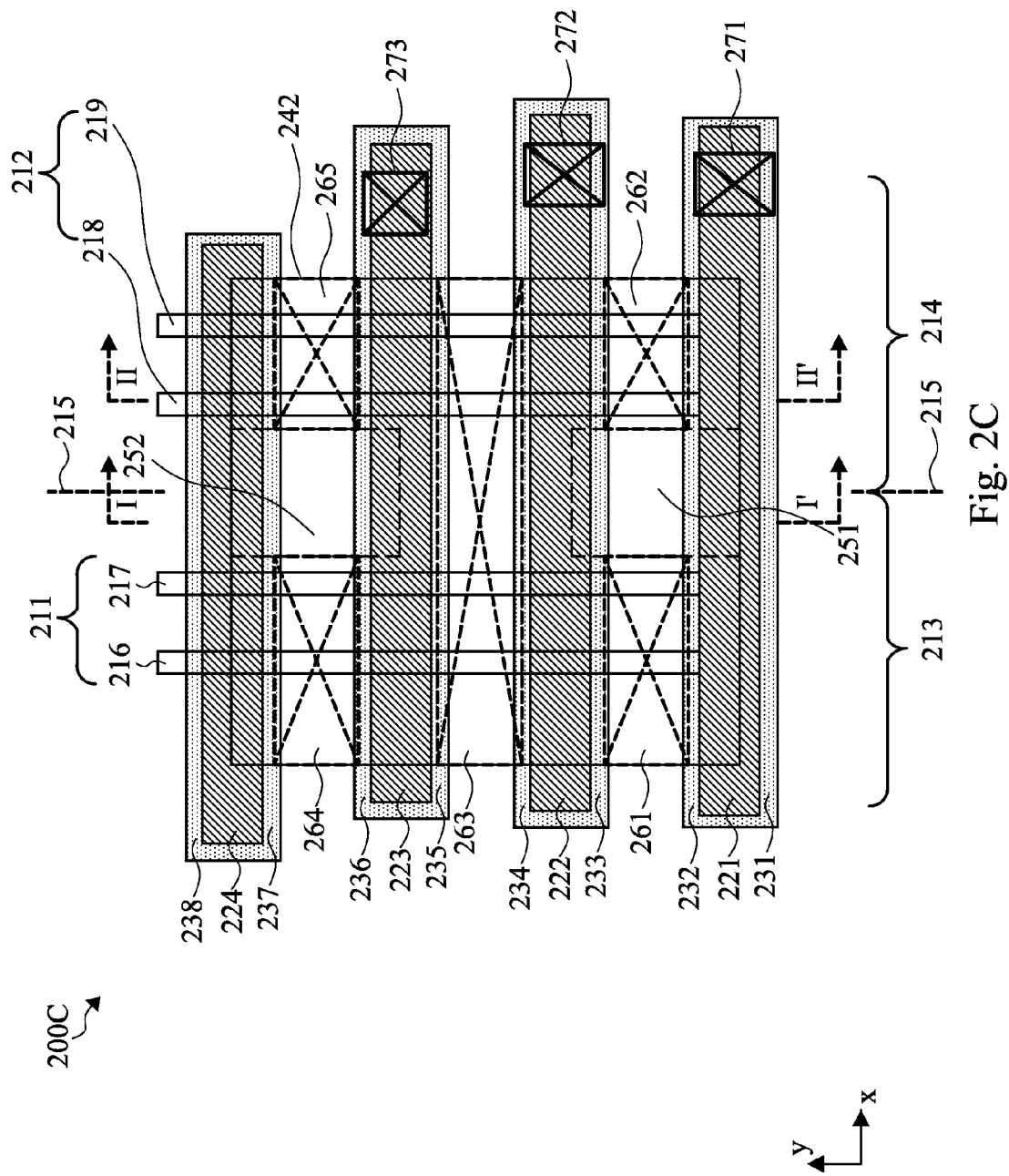
FIG. 2C is a view similar to FIG. 2 and showing a top view of a layout of a semiconductor device, in accordance with some embodiments.

FIGS. 2A and 2B are cross-section views of a semiconductor device 200A having the layout 200. The cross-section view in FIG. 2A is taken along line A-A' in FIG. 2. The cross-section view in FIG. 2B is taken along line B-B' in FIG. 2. The configuration of the semiconductor device 200A is described herein with respect to both FIG. 2A and FIG. 2B.

The semiconductor device 200A comprises a substrate 274 over which various elements of the semiconductor device 200A are formed. The elements of the semiconductor device 200A include active elements and/or passive elements. Examples of active elements include, but are not limited to, transistors and diodes. Examples of transistors are described herein with respect to FIG. 2. Examples of passive elements include, but are not limited to, capacitors, inductors, fuses, and resistors. A plurality of metal layers and via layers are alternatingly formed over the substrate 274 to electrically couple the elements of the semiconductor device 200A with each other and/or with external devices. The substrate 274 comprises, in at least one embodiment, a silicon substrate. The substrate 274 comprises, in at least one embodiment, silicon germanium (SiGe), Gallium arsenic, or other suitable semiconductor materials. For example, semiconductor materials including group III, group IV, and group V elements are within the scope of various embodiments. In some embodiments, the substrate 274 further includes one or more other features, such as various doped regions, a buried layer, and/or an epitaxy (epi) layer. In some embodiments, the substrate 274 comprises a semiconductor on insulator, such as silicon on insulator (SOI). In some embodiments, the substrate 274 includes a doped epi layer, a gradient semiconductor layer, and/or a semiconductor layer overlying another semiconductor layer of a different type such as a silicon layer on a silicon germanium layer.

The semiconductor device 200A further comprises one or more well regions over the substrate 274. In the example configuration in FIGS. 2A and 2B, the n-well region 213 and p-well region 214 are over the substrate 274, as described with respect to FIG. 2.

The semiconductor device 200A further comprises one or more isolation structures over and around the well regions 213, 214. In the example configuration in FIGS. 2A and 2B, the isolation structure 275 is over the well regions 213, 214. The isolation structure 275 electrically isolates various elements of the semiconductor device 200A from each other. For example, as illustrated in FIG. 2B, the isolation structure 275 electrically isolates the active area regions 211, 212 from each other. In at least one embodiment, the isolation structure 275 comprises one or more shallow trench isolation (STI) regions. Example materials of the STI regions include, but are not limited to, silicon oxide, silicon nitride, silicon oxynitride, fluoride-doped silicate, and/or any other low k dielectric materials.

The semiconductor device 200A further comprises active area regions 211, 212 (best seen in FIG. 2B), gate electrodes 221, 222, 223, 224 and corresponding spacers 231, 232, 233, 234, 235, 236, 237, 238 (best seen in FIG. 2A) over the isolation structure 275. In the example configuration in FIG. 2A, the gate electrodes 221, 222, 223, 224 and the corresponding spacers 231, 232, 233, 234, 235, 236, 237, 238 are partially embedded in the isolation structure 275. Other arrangements are within the scope of various embodiments. For example, in one or more embodiments, the gate electrodes 221, 222, 223, 224 and/or the corresponding spacers 231, 232, 233, 234, 235, 236, 237, 238 are above the isolation structure 275.

The semiconductor device 200A further comprises an inter-layer dielectric (ILD) layer 276 over the isolation structure 275. The ILD layer 276 embeds therein the gate electrodes 221, 222, 223, 224 and/or the corresponding spacers 231, 232, 233, 234, 235, 236, 237, 238 (as best seen in FIG. 2A). The ILD layer 276 further embeds therein the fins 216, 217, 218, 219 of the active area regions 211, 212 and contact plugs in the corresponding contact areas 261, 262, 263, 264, 265. For the sake of simplicity, the contact plugs are designated by the same reference numerals of the corresponding contact areas. Two contact plugs 264, 265 are shown in FIG. 2B. The contact plugs are referred to herein as self-aligned contacts (SAC) in one or more embodiments. Example materials of the ILD layer 276 include, but are not limited to, SiNx, SiOx, SiON, SiC, SiBN, SiCBN, or combinations thereof.

The semiconductor device 200A further comprises gate dielectric layers 277, 278, 279, 280. The gate electrodes 221, 222, 223, 224 wraps over the fins 216, 217, 218, 219 of the active area regions 211, 212 in regions (best seen in FIG. 2) where the gate electrodes 221, 222, 223, 224 cross over the fins 216, 217, 218, 219. To electrically isolate the gate electrodes 221, 222, 223, 224 from the fins 216, 217, 218, 219, the gate dielectric layers 277, 278, 279, 280 (illustrated in FIG. 2A) are arranged under and around the corresponding gate electrodes 221, 222, 223, 224. The spacers 231, 232, 233, 234, 235, 236, 237, 238 are over opposite sides of the corresponding gate dielectric layers 277, 278, 279, 280. Example materials of the gate dielectric layers include, but are not limited to, a high-k dielectric layer, an interfacial layer, and/or combinations thereof. Example materials for the high-k dielectric layer include, but are not limited to, silicon nitride, silicon oxynitride, hafnium oxide (HfO2), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, zirconium oxide, titanium oxide, aluminum oxide, hafnium dioxide-alumina (HfO2-Al2O3) alloy, other suitable high-k dielectric materials, and/or combinations thereof.

The semiconductor device 200A further comprises hard masks 291, 292, 293, 294 over top surfaces of the corresponding gate electrodes 221, 222, 223, 224. Example materials of the hard masks 291, 292, 293, 294 include, but are not limited to, silicon nitride, silicon oxynitride, silicon carbide or other suitable materials.

As illustrated in FIG. 2A, the contact plugs fill in the spaces between adjacent spacers. For example, the contact plug 261 fills in the space between adjacent spacers 232, 233. In at least one embodiment, a side face 295 of the contact plug 261 directly contacts a corresponding side face 296 of the spacer 232. The opposite side face of the contact plug 261 also directly contacts a corresponding side face of the spacer 233. In the example configuration in FIG. 2A, the spacers 231, 232, 233, 234, 235, 236, 237, 238 have a tapered profile. As a result, some edges of the contact plugs 261, 262, 263, 264, 265 extend over (or overlap) the corresponding spacers 232, 233, 234, 235, 236, 237 in a top plan view. For example, a top edge 297 of the contact plug 261 extends over the corresponding spacer 232, as best seen in the top plan view in FIG. 2.

As illustrated in FIG. 2B, some edges of the contact plugs are defined by corresponding edges of the first contact patterning region 240 and the second contact patterning regions 251, 252. For example, the edges 281, 283 of the contact plug 265 shown in FIG. 2B correspond to the edge 282 of the first contact patterning region 240 and the edge 284 of the second contact patterning region 252 as described with respect to FIG. 2.

In at least one embodiment, the contact plugs for the active area regions are filled in the spaces between adjacent spacers. As a result, wide landing areas for subsequent vias to make contact with the contact plugs are obtained. The wide landing areas reduce contact resistance. As a result, performance of the semiconductor device is improved in one or more embodiments. Alternatively or additionally, the wide landing areas permit a wider misalignment margin between the contact plugs and corresponding vias and/or between the contact plugs and corresponding butt contacts as described herein. As a result, one or more manufacturing and/or design restraints are relaxed which results in increased yield in one or more embodiments.

In at least one embodiment, boundaries of the contact areas and the corresponding contact plugs are defined by boundaries of the corresponding spacers. As a result, self-aligned isolation structures between the contact plugs and adjacent gate electrodes are obtained. In at least one embodiment, such self-aligned isolation structures permit a contact plug to extend over (or overlap) an adjacent gate electrode without being electrically shorted to the adjacent gate electrode. As a result, a risk of unintended short circuits due to gate electrode pitch reduction is reduced in one or more embodiments.

One or more embodiments permit existing photolithography technique (e.g., 193 immersion) to be applicable to advanced nodes, such as 10 nm and beyond. In some embodiments, the number of masks used for forming contact plugs over active area regions is reduced compared to other approaches.

The contact area patterning techniques described herein in accordance with one or more embodiments are applicable to various types of semiconductor devices, such as memory devices. Other types of semiconductor devices are within the scope of various embodiments.

Figure 3:
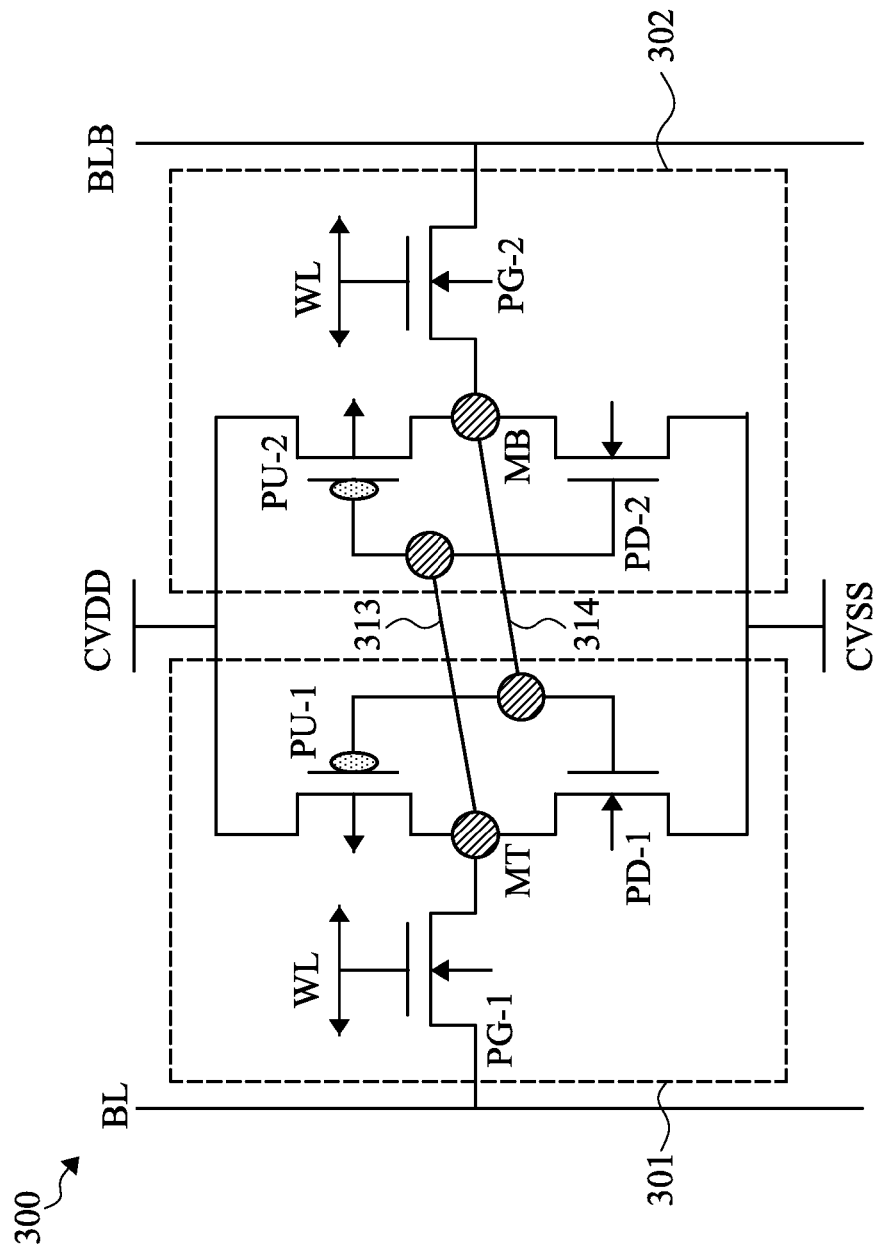
FIG. 3 is a schematic diagram of a memory cell 300 in accordance with one or more embodiments.

FIG. 3 is a schematic diagram of a memory cell 300 in accordance with one or more embodiments. The memory cell 300 comprises a first half 301 and a second half 302. In some embodiments, the first half 301 and the second half 302 are referred to as half-cells. The first half-cell 301 comprises a PMOS transistor PU-1, an NMOS transistor PD-1, and an NMOS transistor PG-1. The transistor PU-1 and the transistor PD-1 are cross-coupled to form a first cross-coupled inverter. The second half-cell 302 comprises a PMOS transistor PU-2, an NMOS transistor PD-2, and an NMOS transistor PG-2. The transistor PU-2 and the transistor PD-2 are cross-coupled to form a second cross-coupled inverter. The first and second cross-coupled inverters form a storage unit. In some embodiments, the transistors PU-1 and PU-2 are referred to as pull-up (PU) devices, the transistors PD-1 and PD-2 are referred to as pull-down (PD) devices, and the transistors PG-1 and PG-2 are referred to as pass-gate (PG) devices.

The sources of the transistors PU-1, PU-2 are electrically coupled to a first power supply node CVDD. The drains of the transistors PU-1, PU-2 are electrically coupled to the drains of the corresponding transistors PD-1, PD-2 at corresponding first and second storage nodes MT and MB. A gate of the transistor PU-1 is electrically coupled to a gate of the transistor PD-1 and the drain of the transistor PD-2. A gate of the transistor PU-2 is electrically coupled to a gate of the transistor PD-2 and the drain of the transistor PD-1. The sources of the transistors PD-1 and PD-2 are electrically coupled to a second power supply node CVSS. In some embodiments, a voltage at the second power supply node CVSS corresponds to a ground voltage. The transistor PG-1 is coupled between a first bit line BL and the first storage node MT. A gate of the transistor PG-1 is coupled to a word line WL. The transistor PG-2 is coupled between a second bit line BLB and the second storage node MB. A gate of the transistor PG-2 is coupled to the word line WL. The transistor PG-1 and transistor PG-2 are configured to be activated based on a signal supplied by the word line WL to selectively connect the corresponding first and second cross-coupled inverters to the corresponding first and second bit lines BL, BLB. The first storage node MT is coupled to the gates of the transistor PU-2 and the transistor PD-2 by a connector 313. The second storage node MB is coupled to the gates of the transistor PU-1 and the transistor PD-1 by a connector 314.

In some embodiments, the memory cell 300 includes a number of transistors other than six. For example, in at least one embodiment, the memory cell 300 includes eight transistors. In some embodiments, the memory cell 300 is a single fin cell, e.g., the transistors PD-1, PD-2, PG-1, PG-2, PU-1 and PU-2 are single-fin FinFET transistors. In some embodiments, the memory cell 300 is a multiple-fin cell, e.g., the transistors PD-1, PD-2, PG-1, PG-2, PU-1 and PU-2 are multiple-fin FinFET transistors. In some embodiments, the transistors PD-1, PD-2, PG-1 and PG-2 in the memory cell 300 are multiple-fin FinFET transistors, and the transistors PU-1 and PU-2 are single-fin FinFET transistors. In some embodiments, the memory cell 300 is a portion of a SRAM memory chip. In some embodiments, one or more single-fin cells and one or more multiple-fin cells are formed in a SRAM memory chip. In some embodiments, a SRAM chip includes an embedded SRAM memory cell array. In some embodiments, a SRAM memory chip includes an embedded SRAM memory cell array and a write assist circuit, where at least a portion of the embedded SRAM memory cell array is electrically coupled to the write assist circuit.

Figure 4A:
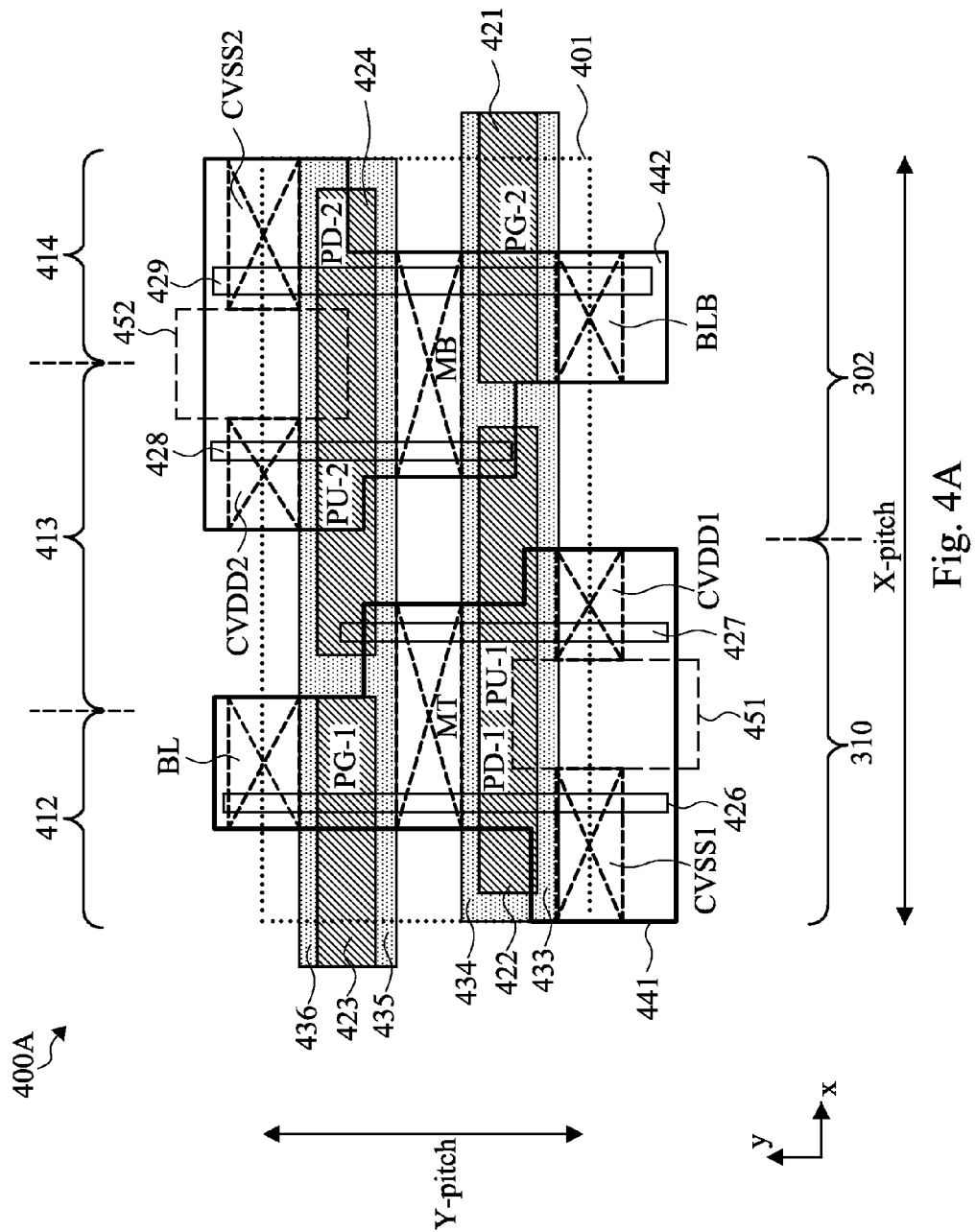
FIG. 4A is a top view of a layout of a memory cell, in accordance with some embodiments.

FIG. 4A is a top view of a layout 400A of a memory cell, in accordance with some embodiments. A dimension of the memory cell in the X direction is referred to as "X-pitch," and a dimension of the memory cell in the Y direction is referred to as "Y-pitch." In the example configuration in FIG. 4A, the Y-pitch is shorter than the X-pitch. In at least one embodiment, the memory cell having the layout 400A corresponds to the memory cell 300. An imaginary boundary 401 of the memory cell 300 is illustrated in FIG. 4A. In the example configuration in FIG. 4A, a left half of the memory cell 300 in the boundary 401 corresponds to the first half-cell 301, and a right half of the memory cell 300 in the boundary 401 corresponds to the second half-cell 302. In at least one embodiment, the first half-cell 301 is symmetrical to the second half-cell 302 across the center point of the memory cell 300.

The memory cell 300 is configured over a plurality of well regions. In the example configuration in FIG. 4A, the memory cell 300 is configured over well regions 412, 413 and 414. In at least one embodiment, the well regions 412 and 414 are p-well regions, and the well region 413 is an n-well region. In at least one embodiment, at least one of the p-well regions 412 and 414 corresponds to the p-well region 214, and the n-well region 413 corresponds to the n-well region 213 described with respect to FIG. 2.

The memory cell 300 comprises a plurality of active area regions. In the example configuration in FIG. 4A, each of the active area regions comprises a fin, and the memory cell 300 comprises fins 426, 427, 428, 429. In at least one embodiment, one or more of the fins 426, 427, 428, 429 correspond to one or more of the fins 216, 217, 218, 219 described with respect to FIG. 2. The described single-fin configuration is an example. Other arrangements with different numbers of fins per active area region are within the scope of various embodiments as described herein.

The memory cell 300 further comprises a plurality of gate electrodes. In the example configuration in FIG. 4A, two gate electrodes are arranged in each of the half-cells 301, 302. For example, gate electrodes 422, 423 are arranged in the first half-cell 301, and gate electrodes 421, 424 are arranged in the second half-cell 302. In at least one embodiment, one or more of the gate electrodes 421, 422, 423, 424 correspond to one or more of the gate electrodes 221, 222, 223, 224 described with respect to FIG. 2.

The memory cell 300 further comprises a plurality of spacers associated with the corresponding gate electrodes. In the example configuration in FIG. 4A, spacers 433, 434 are common for the gate electrodes 421, 422, and extend along longitudinal sides of the gate electrodes 421, 422 in the X direction from the first half-cell 301 to the second half-cell 302. Spacers 435, 436 are common for the gate electrodes 423, 424, and extend along longitudinal sides of the gate electrodes 423, 424 in the X direction from the first half-cell 301 to the second half-cell 302. In at least one embodiment, one or more of the spacers 433, 434, 435, 436 correspond to one or more of the spacers 233, 234, 235, 236 described with respect to FIG. 2.

The transistors PD-1, PD-2, PG-1, PG-2, PU-1 and PU-2 of the memory cell 300 are configured by the corresponding active area regions, i.e., fins 426, 427, 428, 429, and the corresponding gate electrodes 421, 422, 423, 424. For example, the transistor PG-1 comprises a gate configured by the gate electrode 423, and source/drains configured by portions of the fin 426 on opposite sides of the gate electrode 423. For simplicity, the transistors of the memory cell 300 are designated in FIG. 4A at the intersections of the corresponding fins and the corresponding gate electrodes. For example, the transistor PD-1 is designated by reference numeral "PD-1" at an intersection of the corresponding gate electrode 422 and the corresponding fin 426. The NMOS transistors PD-1 and PG-1 are configured over the p-well region 412, the NMOS transistors PD-2 and PG-2 are configured over the p-well region 414, and the NMOS transistors PU-1 and PU-2 are configured over the n-well region 413. In at least one embodiment, one or more of the transistors PD-1, PD-2, PG-1, PG-2, PU-1 and PU-2 correspond to one or more of the transistors described with respect to FIG. 2.

The memory cell 300 further comprises a plurality of contact areas over the corresponding source/drains of the transistors PD-1, PD-2, PG-1, PG-2, PU-1 and PU-2. For simplicity, the contact areas of the memory cell 300 are designated by the corresponding nodes or lines to which the contact areas are coupled. For example, the contact area coupling the transistor PG-1 to the first bit line BL is designated as "BL," the contact area coupling the transistor PG-2 to the second bit line BLB is designated as "BLB," the contact area coupling the transistor PU-1 to the power supply node CVDD is designated as "CVDD1," the contact area coupling the transistor PU-2 to the power supply node CVDD is designated as "CVDD2," the contact area coupling the transistor PD-1 to the power supply node CVSS is designated as "CVSS1," the contact area coupling the transistor PD-2 to the power supply node CVSS is designated as "CVSS2," the contact area coupling the drains of the transistors PU-1, PD-1 and PG-1 corresponds to the storage node MT and is designated as "MT," and the contact area coupling the drains of the transistors PU-2, PD-2 and PG-2 corresponds to the storage node MB and is designated as "MB." In at least one embodiment, one or more of the contact areas of the memory cell 300 correspond to one or more of the contact areas 261, 262, 263, 264, 265 described with respect to FIG. 2.

The layout 400A comprises for each of the half-cells 301, 302 of the memory cell 300 a first contact patterning region and a second contact patterning region. For example, the layout 400A comprises a first contact patterning region 441 and a second contact patterning region 451 for the first half-cell 301, and a first contact patterning region 442 and a second contact patterning region 452 for the second half-cell 302. The first contact patterning region 441 covers active area regions or fins 426, 427, gate electrodes 423, 422 and spacers 433, 434, 435, 436 of the transistors PU-1, PD-1, PG-1 in the first half-cell 301. The second contact patterning region 451 overlaps a portion of the corresponding first contact patterning region 441 between the contact areas CVSS1, CVDD1. The first contact patterning region 442 covers active area regions or fins 428, 429, gate electrodes 421, 424 and spacers 433, 434, 435, 436 of the transistors PU-2, PD-2, PG-2 in the second half-cell 302. The second contact patterning region 452 overlaps a portion of the corresponding first contact patterning region 442 between the contact areas CVSS2, CVDD2. In the example configuration in FIG. 4A, each of the first contact patterning regions 441, 442 extends across the full width of the memory cell in the Y direction, and has a dimension in the Y direction greater than in the X direction. For example, a distance between the uppermost and lowermost edges of the first contact patterning region 441 is greater than a distance between the leftmost and rightmost edges of the first contact patterning region 441. In one or more embodiments, the first contact patterning regions 441, 442 are configured to form openings in corresponding sacrificial layers as described with respect to FIGS. 1A-1B, and the second contact patterning regions 451, 452 are configured to form corresponding patterns of sacrificial material as described with respect to FIGS. 1C-1D. In at least one embodiment, the first contact patterning regions 441, 442 correspond to clear tone patterns on one or more clear tone masks as described with respect to FIG. 1A, and/or the second contact patterning regions 451, 452 correspond to dark tone patterns on one or more dark tone masks as described with respect to FIG. 1C. In at least one embodiment, one or more of the first contact patterning regions 441, 442 correspond to the first contact patterning region 240, and/or one or more of the second contact patterning regions 451, 452 correspond to one or more of the second contact patterning regions 251, 252 described with respect to FIG. 2.

In some embodiments, boundaries of the contact areas of the memory cell 300 in the layout 400A are defined by boundaries of one or more of the corresponding first and second contact patterning regions, spacers and gate electrodes. For example, the boundary of the contact area MT is defined by the boundaries of the first contact patterning region 441 and the spacers 434, 435, in a manner similar to that described with respect to the contact area 263 in FIG. 2. The boundaries of the contact areas CVSS1, CVDD1 are defined by the boundaries of the first contact patterning region 441, the second contact patterning region 451, the spacer 433, and a spacer on a gate electrode of a neighboring memory cell below the boundary 401 of the memory cell 300, in a manner similar to that described with respect to the contact areas 264, 265 in FIG. 2. The boundary of the contact area BL is defined by the boundaries of the first contact patterning region 441, the spacer 436, and a spacer on a gate electrode of a neighboring memory cell above the boundary 401 of the memory cell 300. The boundaries of the contact areas MB, BLB, CVSS2, CVDD2 in the second half-cell 302 are defined in a manner similar to that described with respect to the first half-cell 301.

Figure 4B:
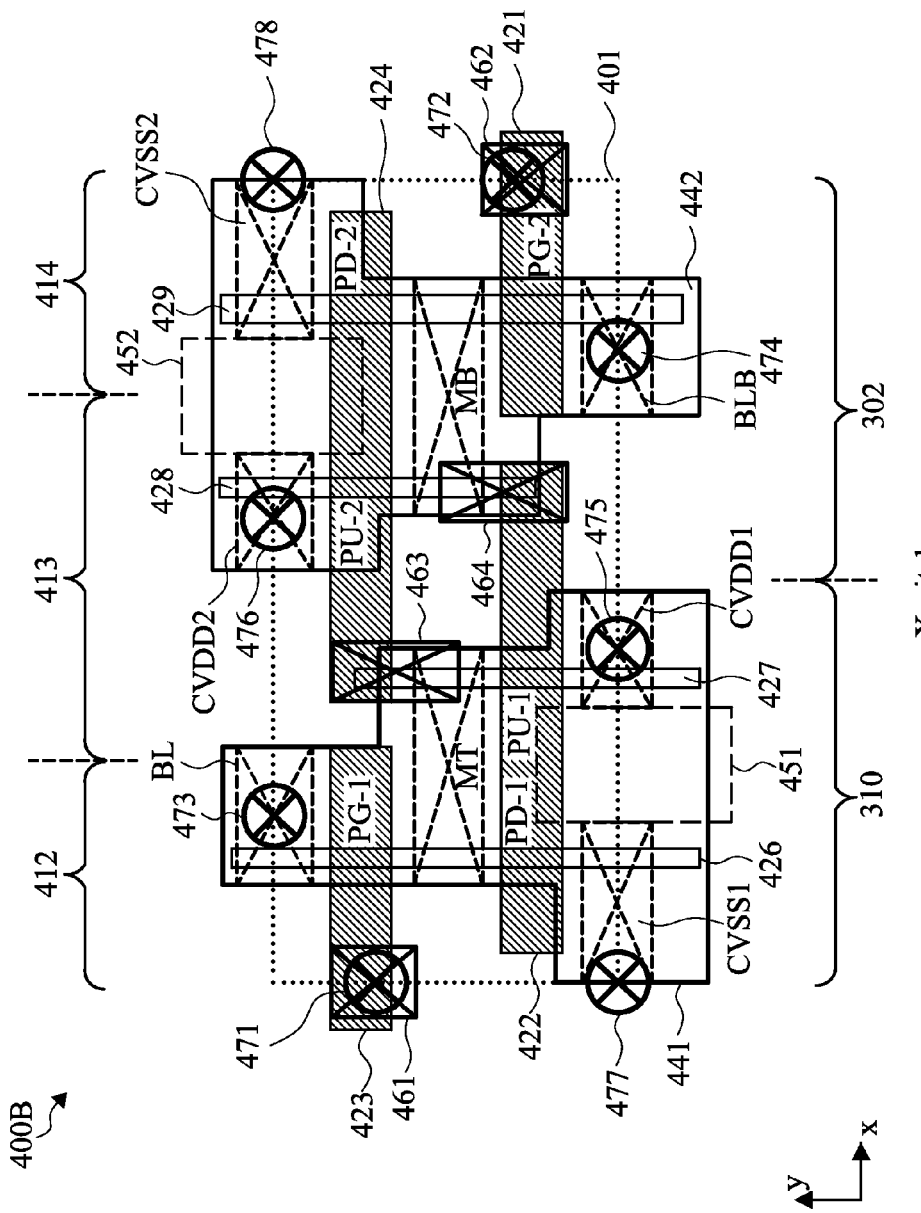
FIG. 4B is a top view of a layout of a memory cell, in accordance with some embodiments.
Figure 4C:
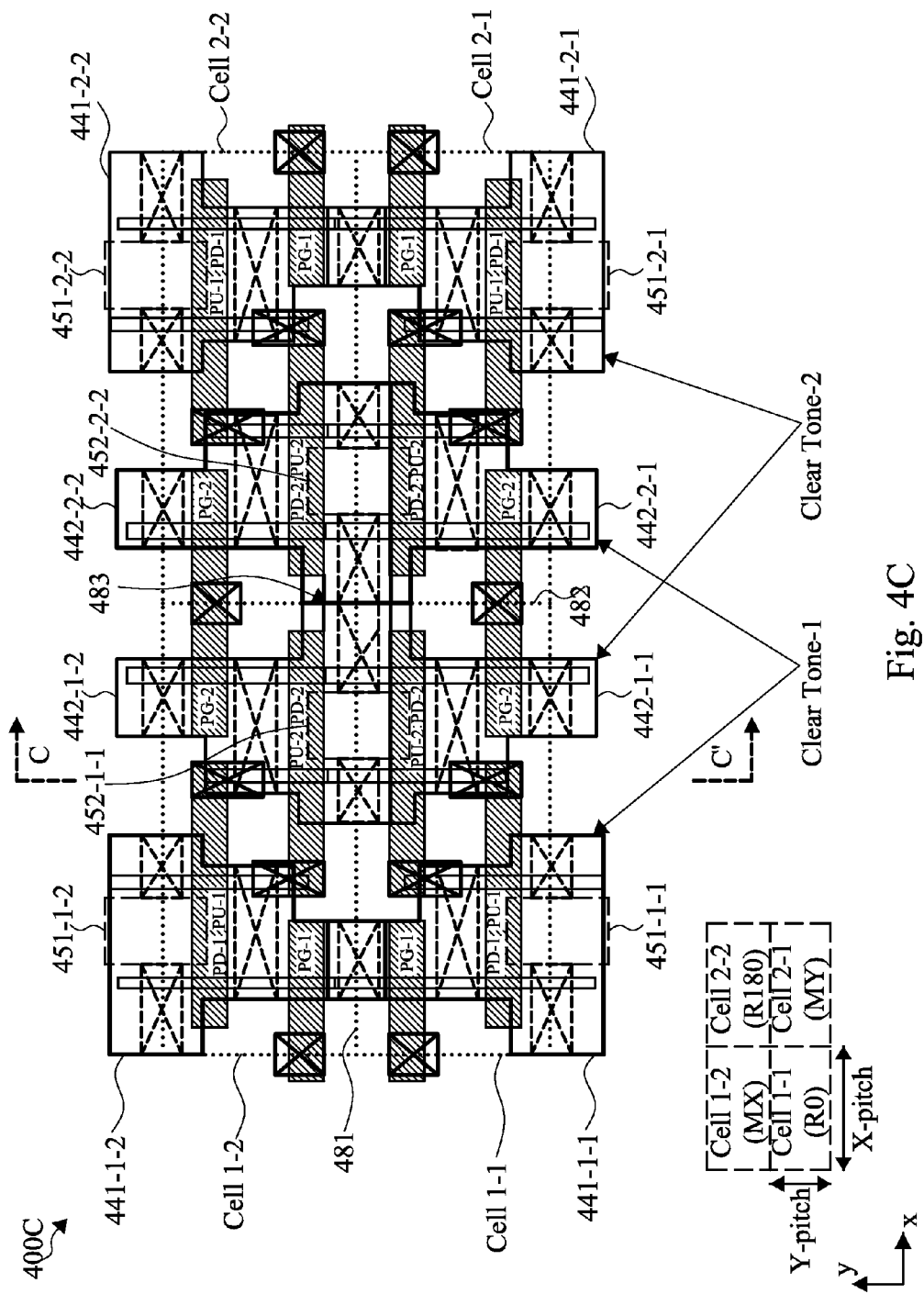
FIG. 4C is a top view of a layout of a portion of a memory device comprising the memory cell layout of FIG. 4B, in accordance with some embodiments.
Figure 4D:
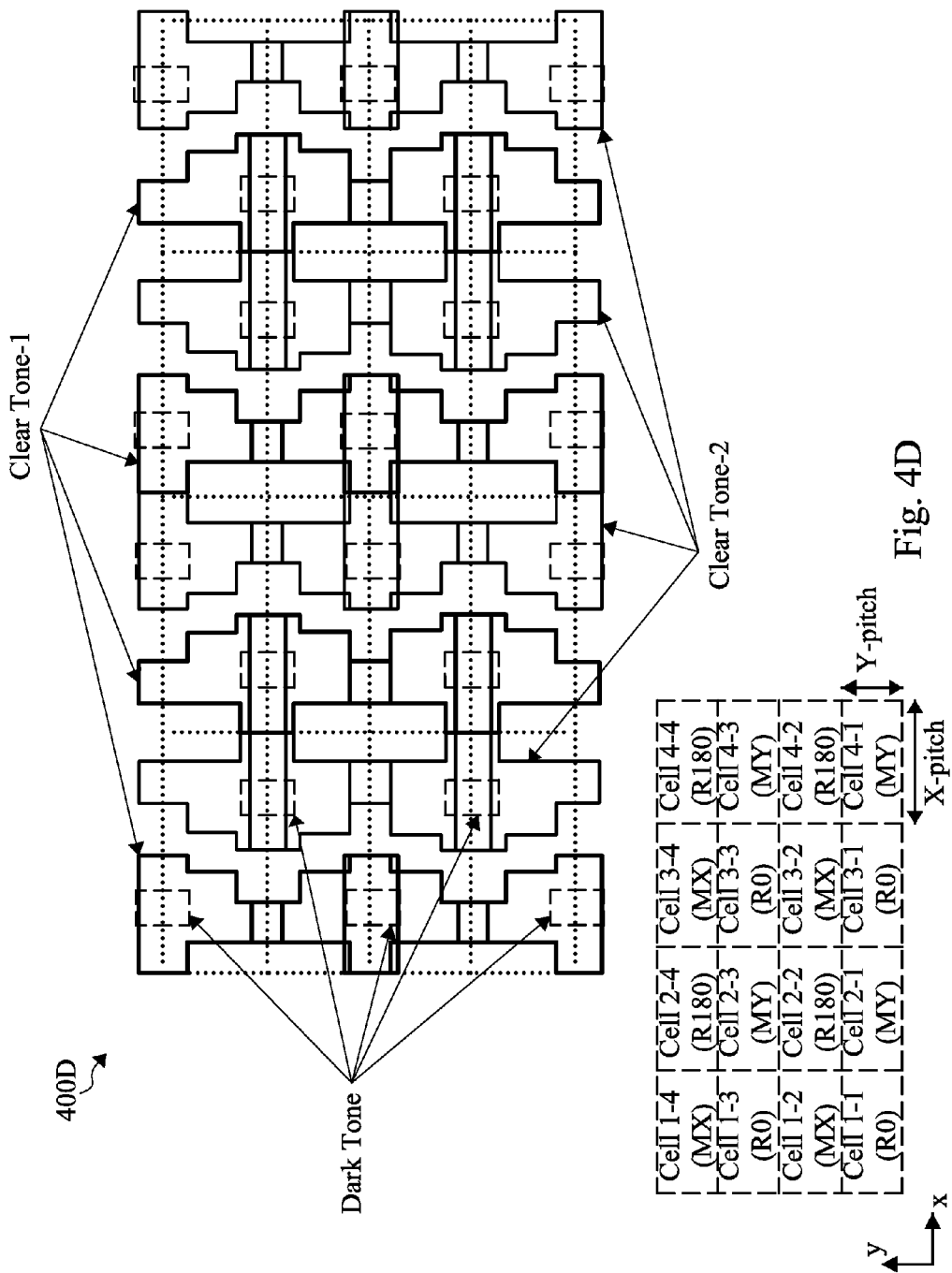
FIG. 4D is a top view of a layout of a portion of a memory device comprising the layout of FIG. 4C, in accordance with some embodiments.

In some embodiments, when a memory device comprising the memory cell 300 is manufactured in accordance with the layout 400A, openings corresponding to the first contact patterning regions 441, 442 for the half-cells 301, 302 are formed in separate photolithography processes, as described with respect to FIGS. 4C-4D. For example, a first photolithography process is performed to form an opening corresponding to the first contact patterning region 441 over the first half-cell 301, and a second photolithography process is performed to form an opening corresponding to the first contact patterning region 442 over the second half-cell 302. A third photolithography process is performed to form material patterns or blocks corresponding to the second contact patterning regions 451, 452 to cover portions of the openings formed over the half-cells 301, 302.

In some embodiments, when a memory device comprising the memory cell 300 is manufactured in accordance with the layout 400A, openings corresponding to the first contact patterning regions 441, 442 for the half-cells 301, 302 are formed in the same photolithography process. For example, a first photolithography process is performed to form an opening corresponding to the first contact patterning region 441 over the first half-cell 301, and an opening corresponding to the first contact patterning region 442 over the second half-cell 302. A second photolithography process is performed to form material patterns or blocks corresponding to the second contact patterning regions 451, 452 to cover portions of the openings formed over the half-cells 301, 302.

FIG. 4B is a top view of a layout 400B of a memory cell, in accordance with some embodiments. In at least one embodiment, the layout 400B includes all components of the layout 400A. However, for simplicity, the spacers 433, 434, 435, 436 of the layout 400A are not illustrated in FIG. 4B. Compared to the layout 400A, the layout 400B further comprises gate contacts 461, 462, butt contacts 463, 464, and vias 471, 472, 473, 474, 475, 476, 477, 478.

The gate contacts 461, 462 are over and electrically coupled to the corresponding gate electrodes 423, 421. The vias 471, 472 are over and electrically coupled to the gate contacts 461, 462. The gate of the transistor PG-1 is electrically coupled to a corresponding word line via the corresponding gate contact 461 and via 471, and the gate of the transistor PG-2 is electrically coupled to the corresponding word line via the corresponding gate contact 462 and via 472.

The butt contact 463 is over the gate electrode 424 and the contact area MT, and electrically couples the contact area MT to the gate electrode 424. The butt contact 464 is over the gate electrode 422 and the contact area MB, and electrically couples the contact area MB to the gate electrode 424. In at least one embodiment, the butt contacts 463, 464 correspond to the connectors 313, 314 of the memory cell 300 described with respect to FIG. 3. In at least one embodiment, the butt contacts 463, 464 are internal to the memory cell 300, and is not electrically coupled to other elements of a memory device comprising the memory cell 300.

In the first half-cell 301, the vias 473, 475, 477 are over the corresponding contact area BL, the contact area CVDD1, and the contact area CVSS1. The contact area BL is electrically coupled to the corresponding bit line BL by the via 473, the contact area CVDD1 is electrically coupled to the first power supply node CVDD by the via 475, and the contact area CVSS1 is electrically coupled to the second power supply node CVSS by the via 477. In the second half-cell 302, the vias 474, 476, 478 are over the corresponding contact area BLB, the contact area CVDD2, and the contact area CVSS2. The contact area BLB is electrically coupled to the corresponding bit line BLB by the via 474, the contact area CVDD2 is electrically coupled to the first power supply node CVDD by the via 476, and the contact area CVSS2 is electrically coupled to the second power supply node CVSS by the via 478.

In some embodiments, the contact areas BL, BLB, MT, MB, CVDD1, CVDD2, CVSS1, CVSS2, the gate contacts 461, 462, and the butt contacts 463, 464 are configured in a lowermost conductive layer, also referred to in at least one embodiment as the metal layer M0, of a memory device comprising the memory cell 300. The vias 471, 472, 473, 474, 475, 476, 477, 478 are configured in a lowermost via layer, also referred to in one or more embodiments as the via layer VIA-0, of the memory device comprising the memory cell 300. The via layer VIA-0 is over the metal layer M0. In at least one embodiment, one or more further conductive layers (such as, metal layers M1, M2 and the like) and/or one or more further via layers (such as, via layers VIA-1, VIA-2 and the like) are sequentially and alternatively arranged over the via layer VIA-0 to form electrical connections from the memory cell 300 to other memory cells or elements of the memory device, and/or to external circuitry outside the memory device.

FIG. 4C is a top view of a layout 400C of a 2×2 portion of a memory device, in accordance with some embodiments. The 2×2 portion of the memory device in the example configuration in FIG. 4C comprises a plurality of memory cells, for example, Cell 1-1, Cell 1-2, Cell 2-1, and Cell 2-2, arranged in an array along the X direction and the Y direction.

In at least one embodiment, the layout of Cell 1-1 corresponds to the layout 400B described with respect to FIG. 4B, and is designated in FIG. 4C as "R0." For simplicity, vias in the VIA-0 layer are not illustrated in FIG. 4C.

The designation "MX" indicates a layout symmetrical to the "R0" layout across the X direction. For example, the layout of Cell 1-2 is symmetrical to the layout of Cell 1-1 across a common edge 481 of Cell 1-1 and Cell 1-2, the common edge 481 is oriented in the X direction, and the layout of Cell 1-2 is designated in FIG. 4C as "MX."

The designation "MY" indicates a layout symmetrical to the "R0" layout across the Y direction. For example, the layout of Cell 2-1 is symmetrical to the layout of Cell 1-1 across a common edge 482 of Cell 1-1 and Cell 2-1, the common edge 482 is oriented in the Y direction, and the layout of Cell 2- is designated in FIG. 4C as "MY."

The designation "R180" indicates a layout symmetrical to the "MX" layout across the Y direction, or symmetrical to the "MY" layout across the X direction. For example, the layout of Cell 2-2 is symmetrical to the layout of Cell 1-2 across a common edge of Cell 1-2 and Cell 2-2, or is symmetrical to the layout of Cell 2-1 across a common edge of Cell 2-1 and Cell 2-2. The layout of Cell 2-2 is designated in FIG. 4C as "R180."

Cells 1-1, 1-2, 2-1, 2-2 comprise first contact patterning regions 441-1-1, 441-1-2, 441-2-1, 441-2-2 corresponding to the first contact patterning region 441 for the first half-cell in the layout 400B. The first contact patterning regions 441-1-1 and 441-1-2 of corresponding Cell 1-1 and Cell 1-2 overlap each other and, in at least one embodiment, together form a single opening when the memory device is manufactured in accordance with the layout 400C. The first contact patterning regions 441-2-1 and 441-2-2 of corresponding Cell 2-1 and Cell 1-2 overlap each other and, in at least one embodiment, together form a single opening when the memory device is manufactured in accordance with the layout 400C.

Cells 1-1, 1-2, 2-1, 2-2 further comprise first contact patterning regions 442-1-1, 442-1-2, 442-2-1, 442-2-2 corresponding to the first contact patterning region 442 for the second half-cell in the layout 400B. The first contact patterning regions 442-1-1 and 442-1-2 of corresponding Cell 1-1 and Cell 1-2 overlap each other and, in at least one embodiment, together form a single opening when the memory device is manufactured in accordance with the layout 400C. The first contact patterning regions 442-2-1 and 442-2-2 of corresponding Cell 2-1 and Cell 2-2 overlap each other and, in at least one embodiment, together form a single opening when the memory device is manufactured in accordance with the layout 400C.

In the example configuration in FIG. 4C, the overlapping first contact patterning regions 442-1-1, 442-1-2 and the overlapping first contact patterning regions 442-2-1 and 442-2-2 touch or overlap each other. For example, the overlapping first contact patterning regions 442-1-1, 442-1-2 and the overlapping first contact patterning regions 442-2-1 and 442-2-2 have a common edge 483. As a result, a joined contact area for electrical connection to the second power supply node CVSS is formed at the center of the layout 400C for adjacent Cell 1-1, Cell 1-2, Cell 2-1 and Cell 2-2. In at least one embodiment, separate contact areas for electrical connection to the second power supply node CVSS are formed for adjacent memory cells, as described with respect to FIG. 4E.

Cells 1-1, 1-2, 2-1, 2-2 further comprise second contact patterning regions 451-1-1, 451-1-2, 451-2-1, 451-2-2 corresponding to the second contact patterning region 451 for the first half-cell in the layout 400B. Cells 1-1 and 1-2 further comprise a common second contact patterning regions 452-1-1 corresponding to the second contact patterning region 452 for the second half-cell in the layout 400B. Cells 2-1 and 2-2 further comprise a common second contact patterning regions 452-2-2 corresponding to the second contact patterning region 452 for the second half-cell in the layout 400B.

In some embodiments, openings corresponding to the first contact patterning regions in the layout of a memory cell are formed in separate photolithography processes. In the example configuration in FIG. 4C, openings corresponding to the overlapping first contact patterning regions 441-1-1 and 441-1-2 of corresponding Cell 1-1 and Cell 1-2 and the overlapping first contact patterning regions 442-2-1 and 442-2-2 of corresponding Cell 2-1 and Cell 2-2 are formed in a first photolithography process using a first, clear tone mask Clear Tone-1. Openings corresponding to the overlapping first contact patterning regions 441-2-1 and 441-2-2 of corresponding Cell 2-1 and Cell 2-2 and the overlapping first contact patterning regions 442-1-1 and 442-1-2 of corresponding Cell 1-1 and Cell 1-2 are formed in a second photolithography process using a second, clear tone mask Clear Tone-2. The openings are partially covered by material blocks formed corresponding to the second contact patterning regions 451-1-1, 451-1-2, 451-2-1, 451-2-2, 452-1-1, 452-2-2 in a third photolithography process using a third, dark tone mask.

In some embodiments, openings corresponding to the first contact patterning regions in the layout of a memory cell are formed in the same photolithography process. For example, openings corresponding to the overlapping first contact patterning regions 441-1-1 and 441-1-2, the overlapping first contact patterning regions 442-2-1 and 442-2-2, the overlapping first contact patterning regions 441-2-1 and 441-2-2, and the overlapping first contact patterning regions 442-1-1 and 442-1-2 are formed in a first photolithography process using a clear tone mask. The openings are partially covered by material blocks formed corresponding to the second contact patterning regions 451-1-1, 451-1-2, 451-2-1, 451-2-2, 452-1-1, 452-2-2 in a second photolithography process using a dark tone mask.

FIG. 4D is a top view of a layout 400D of a 4×4 portion of a memory device, in accordance with some embodiments. For simplicity, gate electrodes, active area regions, contact areas over the active area regions, butt contacts, and gate contacts are omitted in FIG. 4D. Cell boundaries, first contact patterning regions corresponding to clear tone patterns, and second contact patterning regions corresponding to dark tone patterns are illustrated in FIG. 4D. The layout 400D is obtained by repeating the layout 400C in the X direction and the Y direction. For example, Cell 1-3, Cell 3-1, and Cell 3-3 correspond to Cell 1-1. Cell 1-4, Cell 3-2, and Cell 3-4 correspond to Cell 1-2. Cell 2-3, Cell 4-1, and Cell 4-3 correspond to Cell 2-1. Cell 2-4, Cell 4-2, and Cell 4-4 correspond to Cell 2-2. The described 4×4 configuration is an example. Other configurations with larger or smaller sizes are within the scope of various embodiments.

In some embodiments, as described with respect to FIG. 4C, openings corresponding to the first contact patterning regions in the layout 400D are formed in separate photolithography processes using corresponding clear tone masks Clear Tone-1 and Clear Tone-2. The openings are partially covered by material blocks formed corresponding to the second contact patterning regions in a further photolithography process using a dark tone mask Dark Tone.

In some embodiments, the clear tone masks Clear Tone-1 and Clear Tone-2 are combined in one clear tone mask for forming openings corresponding to the first contact patterning regions in the layout 400D in the same photolithography process. The openings are partially covered by material blocks formed corresponding to the second contact patterning regions in a further photolithography process using the dark tone mask Dark Tone.

Figure 4E:
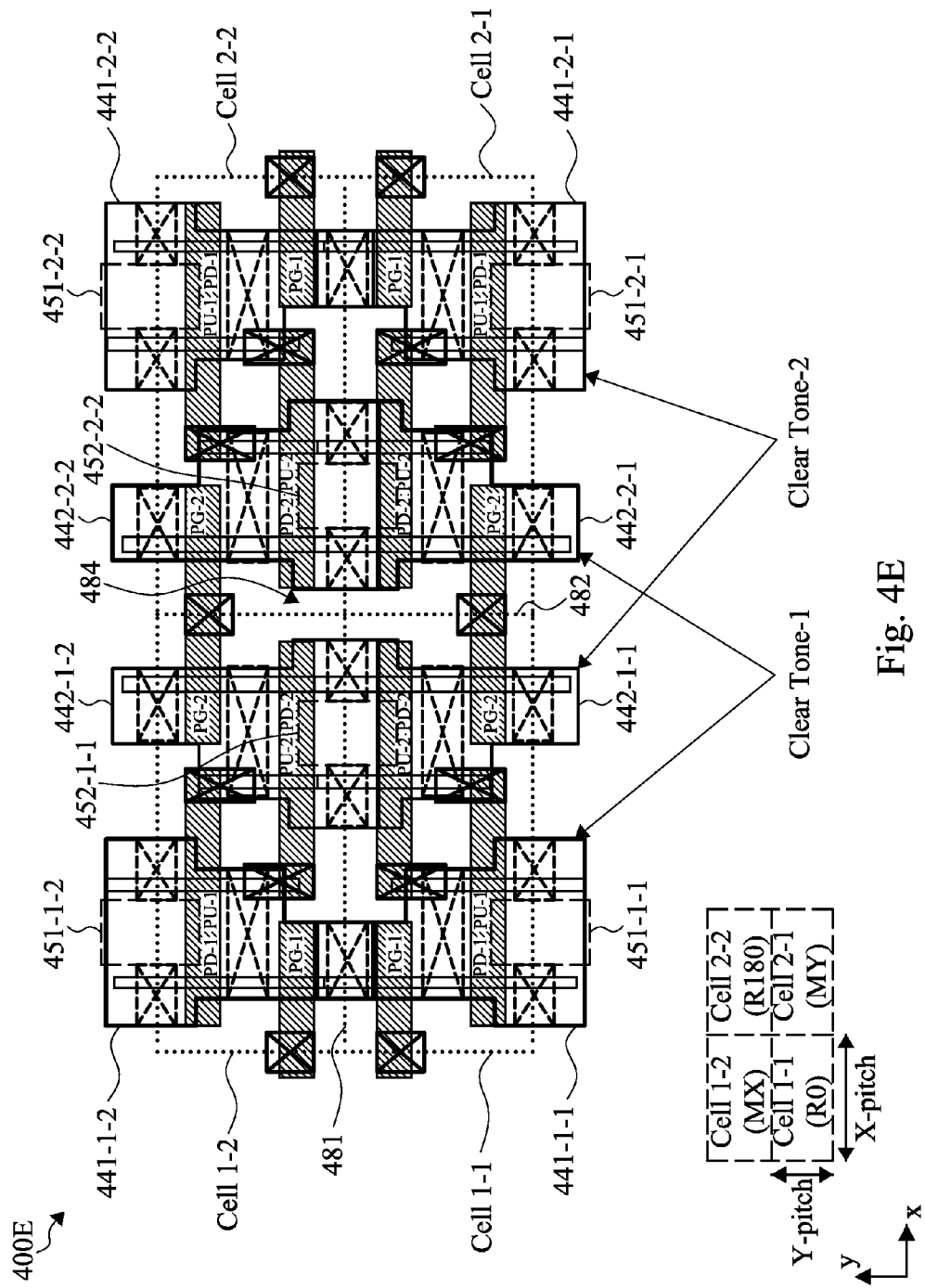
FIG. 4E is a top view of a layout of a portion of a memory device, in accordance with some embodiments.

FIG. 4E is a top view similar to FIG. 4C, and shows a layout 400E of a 2×2 portion of a memory device, in accordance with some embodiments. Compared to the layout 400C where the overlapping first contact patterning regions 442-1-1, 442-1-2 and the overlapping first contact patterning regions 442-2-1 and 442-2-2 have a common edge 483, in the layout 400E, the overlapping first contact patterning regions 442-1-1, 442-1-2 and the overlapping first contact patterning regions 442-2-1 and 442-2-2 do not touch or overlap each other, as shown in a region 484 in FIG. 4E. As a result, a contact area for electrical connection of transistors PD-2 in Cell 1-1, Cell 1-2 to the second power supply node CVSS is separated from a contact area for electrical connection of transistors PD-2 in Cell 2-1, Cell 2-2 to the second power supply node CVSS. In some embodiments, openings corresponding to the first contact patterning regions in the layout 400E are formed in separate photolithography processes. In some embodiments, openings corresponding to the first contact patterning regions in the layout 400E are formed in the same photolithography process.

Figure 4F:
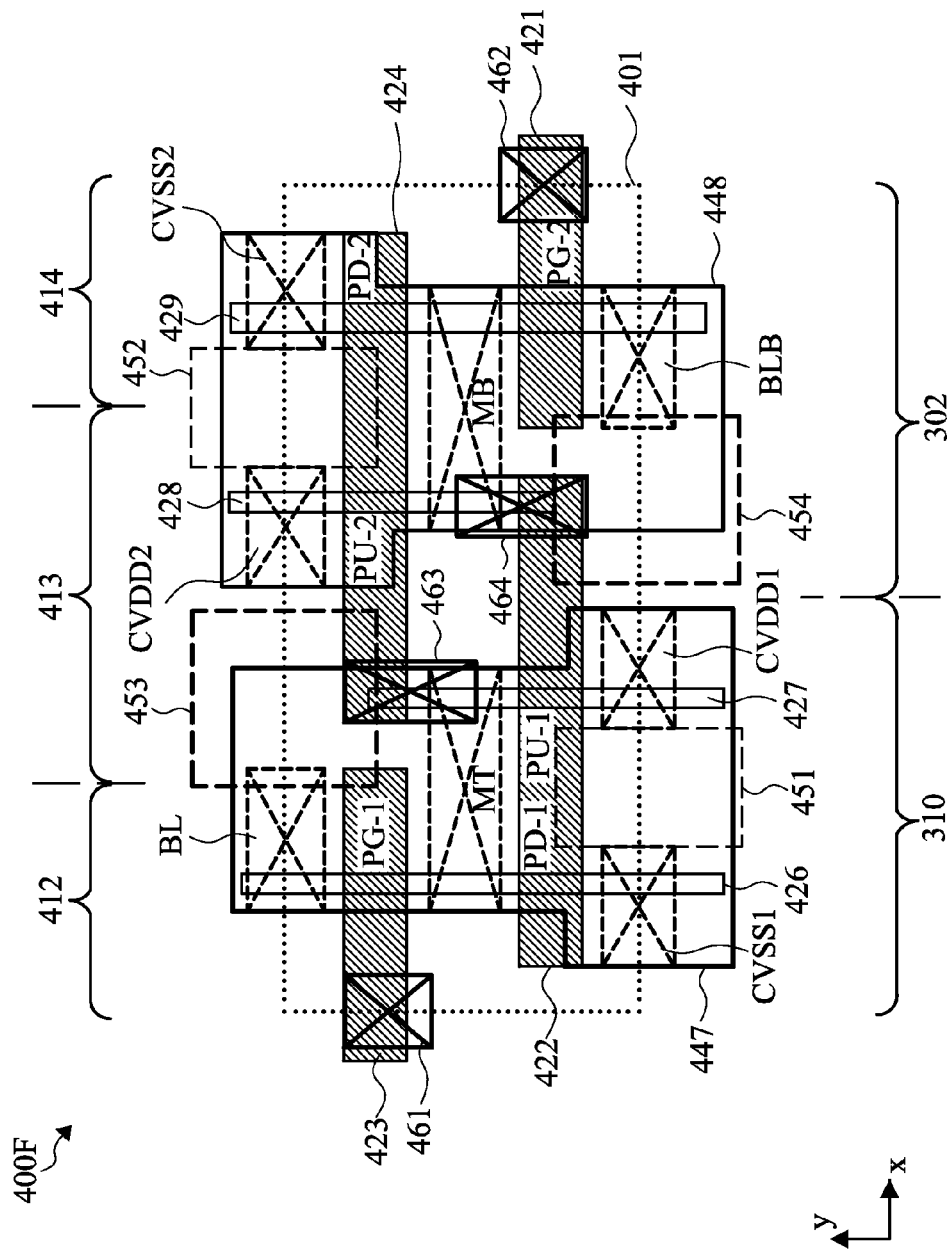
FIG. 4F is a top view of a layout of a memory cell, in accordance with some embodiments.

FIG. 4F is a top view similar to FIG. 4B, and shows a layout 400F of a memory cell, in accordance with some embodiments. For simplicity, vias in the VIA-0 layer are not illustrated in FIG. 4F. Compared to the layout 400B where the contact area BL has two opposite edges defined by corresponding edges of the first contact patterning region 441, in the layout 400F, the contact area BL has an edge defined by a corresponding edge of a first contact patterning region 447 and an opposite edge defined by a corresponding edge of a second contact patterning region 453. Similarly, the contact area BLB has an edge defined by a corresponding edge of a first contact patterning region 448 and an opposite edge defined by a corresponding edge of a second contact patterning region 454. In at least one embodiment, the first contact patterning regions 447, 448 correspond to one or more clear tone masks, and the second contact patterning regions 451, 452, 453, 454 correspond to one or more dark tone masks. For example, openings corresponding to the first contact patterning regions 447, 448 are formed in the same photolithography process, or in separate photolithography processes, using one more clear tone masks. The openings are partially covered by material blocks formed corresponding to the second contact patterning regions 451, 452, 453, 454 in a further photolithography process using a dark tone mask. In at least one embodiment, material blocks corresponding to the second contact patterning regions 451, 452 are formed in a photolithography process using a dark tone mask, and material blocks corresponding to the second contact patterning regions 453, 454 are formed in a further photolithography process using a further dark tone mask.

The described layouts for memory cells and/or memory devices are examples. Other configurations are within the scope of various embodiments. In some embodiments, one or more effects described with respect to FIGS. 2, 2A, 2B and 2C are obtained in a memory cell or memory device having a layout described with respect to one or more of FIGS. 3, 4A-4F.

Figure 5A:
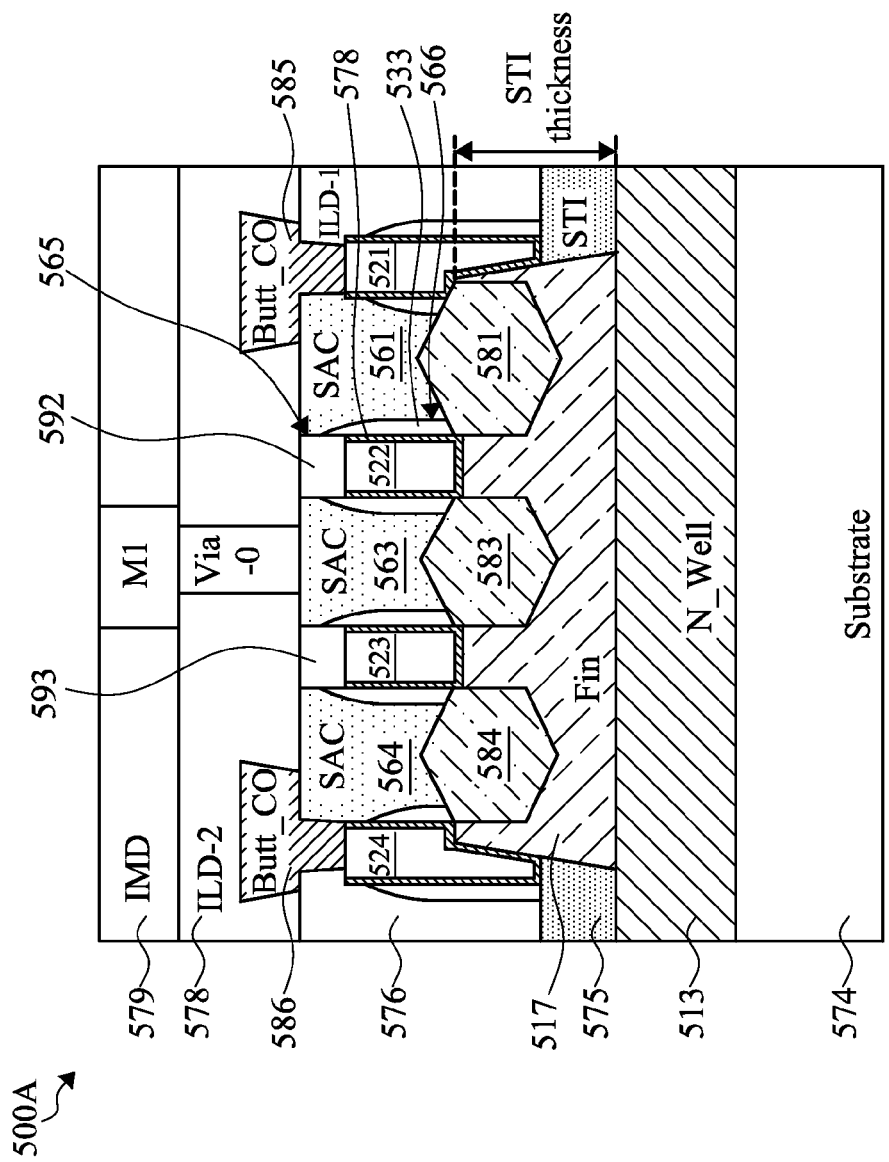
FIGS. 5A and 5B are cross-section views of various memory devices taken along line C-C' in FIG. 4C, in accordance with some embodiments.

FIG. 5A is cross-section views of a memory device 500A taken along line C-C' in FIG. 4C, in accordance with some embodiments. The memory device 500A comprises a substrate 574, an n-well region 513 over the substrate 574, an isolation structure 575 over and around the n-well region 513, a fin 517 over the n-well region 513 and partially embedded in the isolation structure 575, a plurality of gate electrodes 521, 522, 523, 524 over the fin 517, and a first ILD layer (referred to herein as "ILD-1 layer" in one or more embodiments) 576 over the isolation structure 575 and around the fin 517 and the gate electrodes 521, 522, 523, 524. In the cross-section shown in FIG. 5A, the isolation structure 575 has a thickness less than the fin 517; however, outside the cross-section shown in FIG. 5A, the isolation structure 575 includes regions where the thickness of the isolation structure 575 is higher, as indicated by the arrow designated with "STI thickness" in FIG. 5A. In some embodiments, the substrate 574, n-well region 513, isolation structure 575, fin 517, gate electrodes 521, 522, 523, 524 and ILD-1 layer 576 correspond to the substrate 274, n-well region 213, isolation structure 275, one or more fins 216-219, gate electrodes 221, 222, 223, 224 and ILD layer 276 described with respect to FIGS. 2A and 2B.

The memory device 500A further comprises gate dielectric layers arranged under and around the corresponding gate electrodes 521, 522, 523, 524, and spacers over opposite sides of the corresponding gate dielectric layers, and hard masks over top surfaces of the corresponding gate electrodes 522, 523, as described with respect to FIGS. 2A-2B. A gate dielectric layer 578 and a spacer 533 corresponding to the gate electrode 522, and hard masks 592, 593 corresponding to the gate electrodes 522, 523 are designated in FIG. 5A.

The fin 517 includes source/drains 581, 583, 584 between adjacent gate electrodes 521, 522, 523, 524. In the example configuration in FIG. 5A and as best seen in FIG. 4C, the gate electrodes 521, 522, 523, 524 correspond to gates of the PU-1 transistors and PU-2 transistors of the adjacent memory cells Cell 1-1, Cell 1-2, the source/drains 581, 583, 584 correspond to source/drains of the PU-2 transistors of the memory cells Cell 1-1, Cell 1-2. In some embodiments, the source/drains 581, 583, 584 comprise strained material including, but are not limited to, SiGe, SiC, and SiP.

The memory device 500A further comprises contact plugs 561, 563, 564. The contact plugs 561, 563, 564 are electrically coupled to the corresponding source/drains 581, 583, 584. In some embodiments, one or more of the contact plugs 561, 563, 564 correspond to one or more of the contact plugs 261, 263, 264 described with respect to FIGS. 2A-2B. In the example configuration in FIG. 5A and as shown in FIG. 4C, the contact plugs 561 is electrically coupled to a storage node of a half-cell of the Cell 1-1, the contact plugs 563 is electrically coupled to first power supply node CVDD, and the contact plugs 564 is electrically coupled to a storage node of a half-cell of the Cell 1-2. In some embodiments, top surfaces of the hard masks 592, 593 are flush with top surfaces of the contact plugs 561, 563, 564, due to, for example, a planarization process.

The memory device 500A further comprises butt contacts (Butt-CO) 585, 586. The butt contact 585 is over and electrically couples the contact plug 561 to the gate electrode 521. The butt contact 586 is over and electrically couples the contact plug 564 to the gate electrode 524. In some embodiments, one or more of the butt contacts 585, 586 correspond to one or more of the butt contacts 463, 464 described with respect to FIG. 4B. In some embodiments, top surfaces of the butt contacts 585, 586 are higher than the top surfaces of the contact plugs 561, 563, 564.

The memory device 500A further comprises a second ILD layer 578 (referred to herein as "ILD-2 layer" in one or more embodiments) over the ILD-1 layer 576, the butt contacts 585, 586, the hard masks 592, 593 and the contact plugs 561, 563, 564. A plurality of vias of a VIA-0 layer are in the ILD-2 layer 578 to electrically couple the corresponding contact plug 563 and butt contacts 585, 586 to other elements of the memory device 500A.

The memory device 500A further comprises an intermetal dielectric (IMD) layer 579 over the ILD-2 layer 578. The IMD layer 579 includes interconnects, such as metal lines of the metal layers M1, for electrically coupling the vias in the VIA-0 layer to other elements of the memory device 500A. In some embodiments, the memory device 500A comprises one or more further ILD layers and/or metal layers over the IMD layer 579.

In the example configuration in FIG. 5A, the boundaries of the contact plugs 561, 563, 564 are defined by the boundaries of the corresponding spacers and gate electrodes. For example, a left side of the contact plug 561 has an upper portion 565 and a lower portion 566. The upper portion 565 of the contact plug 561 contacts a corresponding sidewall of the hard mask 592. In at least one embodiment, hard masks and gate dielectric layers are formed by the same mask as the corresponding gate electrodes. As a result, the boundary of the hard mask 592 is considered to correspond to the boundary of the gate electrode 522. The upper portion 565 on the boundary of the contact plug 561 contacts the corresponding sidewall of the hard mask 592, and the contact plug 561 is considered to have a boundary defined by the boundary of the gate electrode 522. The lower portion 566 of the contact plug 561 has a boundary defined by the boundary of the spacer 533, as described with respect to FIG. 2A.

In some embodiments, the butt contacts 585, 586 are formed in one or more processes separately from the contact plugs 561, 563, 564. For example, after the formation of the contact plugs as described herein with respect to FIGS. 6A-I, 6A-II to FIGS. 6F-I, 6F-II or with respect to FIGS. 7A-7F, one or more etching processes are performed to form openings through portions of the ILD-2 layer 578 over the gate electrodes 521, 524 and the contact plugs 561, 564. The etching processes further remove hard masks over the gate electrodes 524, 521 to expose the gate electrodes 524, 521. A conductive material, such as a metal, is deposited into the openings to form the butt contacts 585, 586.

Figure 5B:
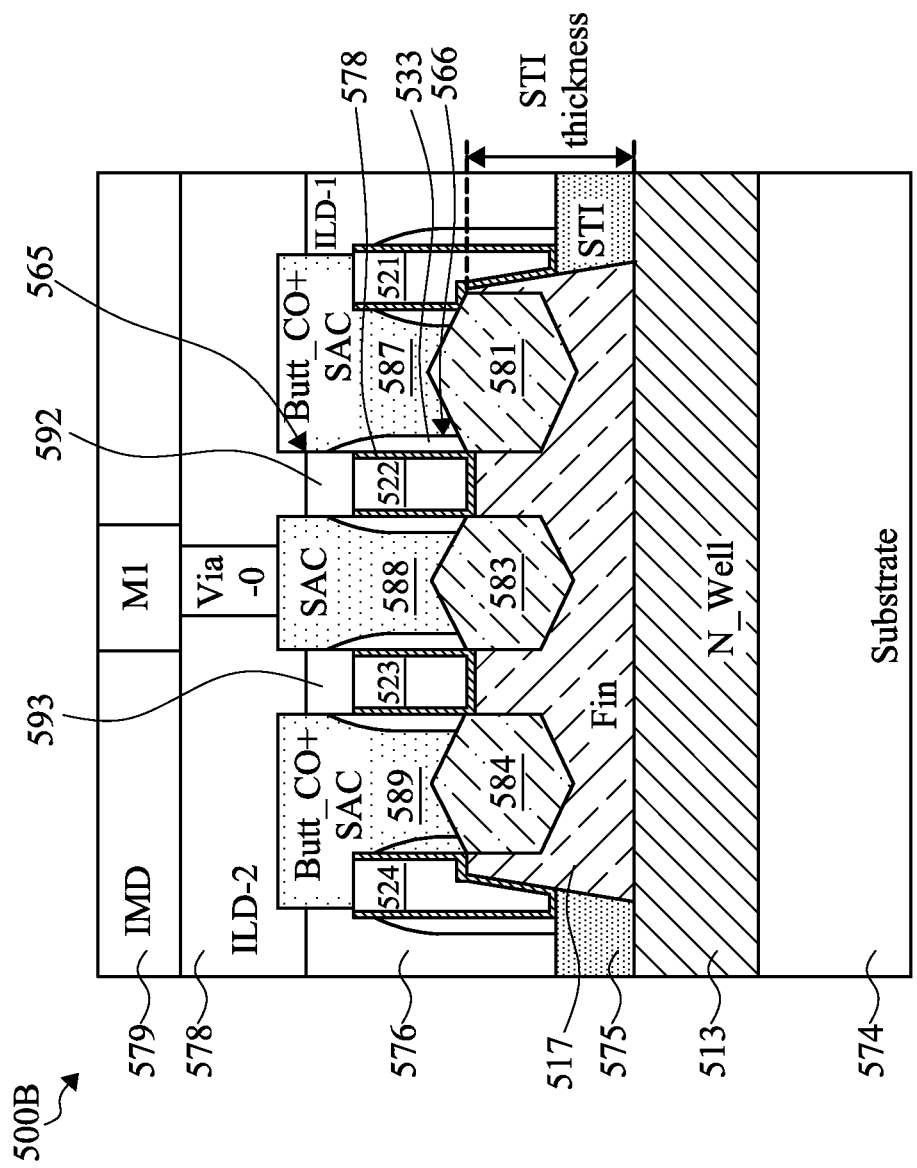

FIG. 5B is cross-section views of a memory device 500B taken along line C-C' in FIG. 4C, in accordance with some embodiments. Compared to the memory device 500A where the butt contacts 585, 586 and the corresponding contact plugs 561, 564 are formed in one or more separate processes, the butt contacts and corresponding contact plugs in the memory device 500B are formed together in one or more common processes.

Figures 7E, 7F:
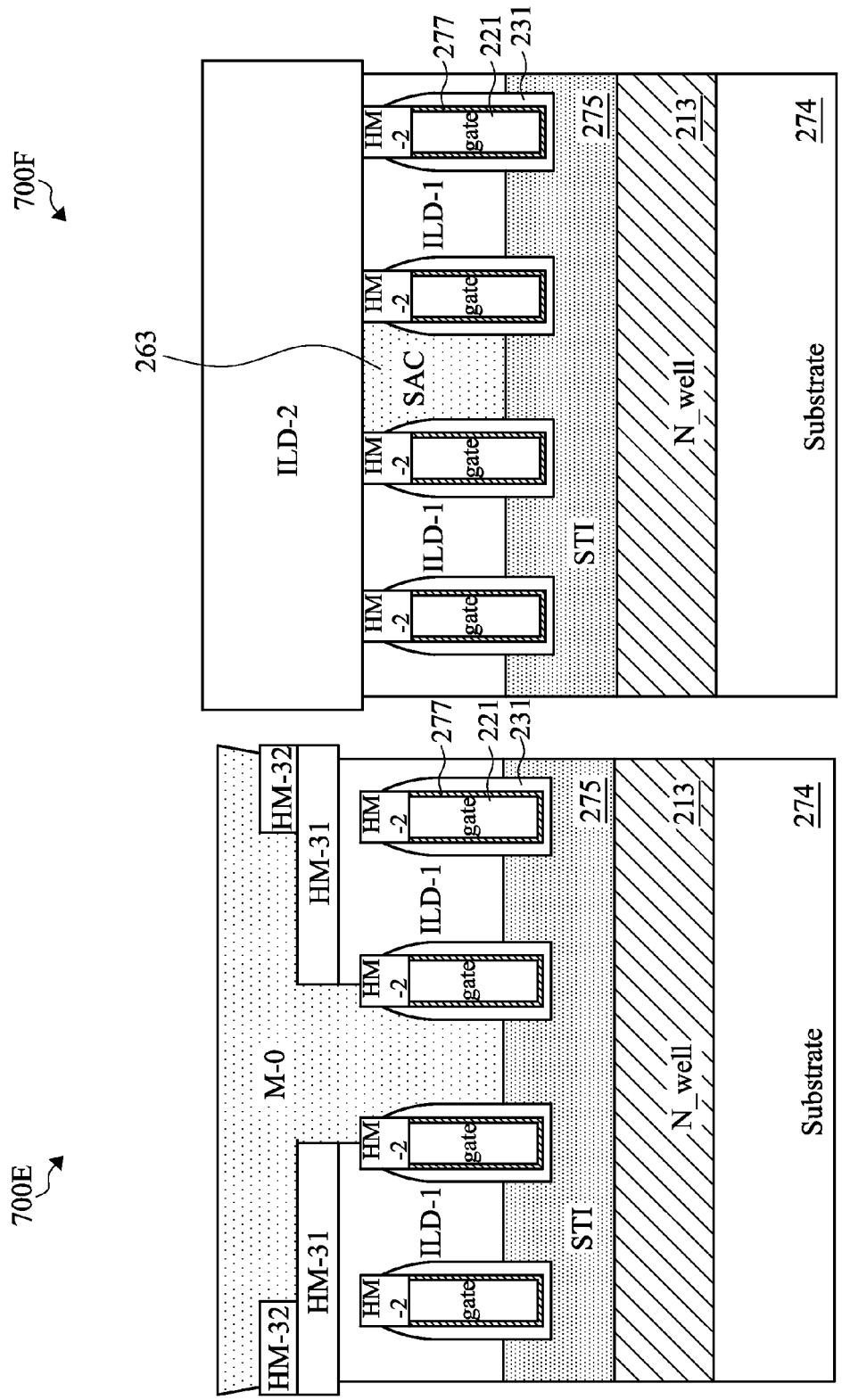

For example, when openings exposing the source/drains are formed for contact plugs as described with respect to FIGS. 6D-I, 6D-II or FIG. 7D, such openings are also formed to expose the adjacent gate electrodes. As a result, when a conductive material, such as a metal, is deposited into the openings to form the contact plugs as described with respect to FIGS. 6E-I, 6E-II or FIG. 7E, combined Butt_CO+SAC contacts 587, 589, and a contact plug 588 are formed in the memory device 500B. The Butt_CO+SAC contact 587 corresponds to the contact plug 561 and the butt contact 585 of the memory device 500A, the combined Butt_CO+SAC contact 589 corresponds to the contact plug 564 and the butt contact 586 of the memory device 500A, and the contact plug 588 corresponds to the contact plug 563 of the memory device 500A. In some embodiments, top surfaces of the Butt_CO+SAC contacts 587, 589 and the contact plug 588 are flush, for example, due to a planarization process. In some embodiments, the top surfaces of the Butt_CO+SAC contacts 587, 589 and the contact plug 588 are higher than top surfaces of the hard masks 592, 593. In some embodiments, one or more effects described with respect to FIGS. 2, 2A, 2B and 2C are obtained in the memory device 500A and/or memory device 500B.

FIGS. 6A-I~6F-I are cross-section views of a semiconductor device taken along line I-I' in FIG. 2C, and FIGS. 6A-II~6F-II are cross-section views of the semiconductor device taken along line II-II' in FIG. 2C, at various manufacturing stages of the semiconductor device, in accordance with some embodiments. In the example configurations described with respect to FIGS. 6A-I~6F-I and 6A-II~6F-II, the semiconductor device comprises FinFET devices. Other arrangements, such as planar MOS devices are within the scope of various embodiments.

As illustrated in FIGS. 6A-I and 6A-II, an n-well region 213 and a p-well region 214 are formed in a substrate 274. In at least one embodiment, the n-well region 213 and p-well region 214 are formed by doping the substrate 274 with corresponding n-type and p-type dopants by ion implantation. Example p-type dopants include, but are not limited to, boron or $BF_2$. Example n-type dopants include, but are not limited to, phosphorus and arsenic.

A plurality of fins is formed over the n-well region 213 and p-well region 214. FIG. 6A-II shows a fin 218 over the p-well region 214. Example materials of the fin 218 include, but are not limited to, silicon, germanium or compound semiconductor. The fin 218 is formed by one or more suitable process including, but not limited to, deposition, photolithography, and/or etching processes. In an example, the fin 218 is formed by patterning and etching a portion of the silicon substrate 274. In another example, the fin 218 is formed by patterning and etching a silicon layer deposited overlying an insulator layer (for example, an upper silicon layer of a silicon-insulator-silicon stack of an SOI substrate).

One or more isolation structures 275 are formed over the substrate 274 to define and electrically isolate the fins, such as fin 218. In one example, the isolation structures 275 include local oxidation of silicon (LOCOS) and/or shallow trench isolation (STI) regions. Example materials of the isolation structures 275 include, but are not limited to, silicon oxide, silicon nitride, silicon oxynitride, fluoride-doped silicate glass (FSG), a low-K dielectric material, and/or combinations thereof. In an example, the formation of the isolation structures 275 includes filling trenches between the fins, for example, by a chemical vapor deposition (CVD) process, with a dielectric material. In some embodiments, the filled trench has a multi-layer structure, such as a thermal oxide liner layer filled with silicon nitride or silicon oxide.

A plurality of gate electrodes 621, 622, 623, 624 is formed over the substrate 274, crossing the fins. Example materials of the gate electrodes 621, 622, 623, 624 include, but are not limited to, poly-silicon, and doped poly-silicon with uniform or non-uniform doping. In one or more embodiments, the poly-silicon is doped for proper conductivity in a gate-first process. In one or more embodiments, the poly-silicon is not doped where the poly gates 621, 622, 623, 624 are dummy gates to be replaced in a gate replacement (gate-last) process. The gate electrodes 621, 622, 623, 624 are referred to herein as poly gates 621, 622, 623, 624. In some embodiments, gate dielectric layers are formed under the poly gates 621, 622, 623, 624. In one or more embodiments, the poly gates 621, 622, 623, 624 are formed by depositing a poly-silicon layer over the substrate 274 with the fins and the isolation structures 275 thereon, in a low-pressure chemical vapor deposition (LPCVD) process or a plasma-enhanced chemical vapor deposition (PECVD) process. In an example, a layer of photoresist is formed over the poly-silicon layer by a suitable process, such as, spin-on coating. The layer of photoresist is patterned to form patterned photoresist features by a proper lithography patterning process. The patterned photoresist features are then transferred by a dry etching process to the underlying poly-silicon layer to form the poly gates 621, 622, 623, 624. The patterned photoresist layer is stripped thereafter.

In another example, a first hard mask layer is formed over the poly-silicon layer, a patterned photoresist layer is formed over the hard mask layer, and the pattern of the photoresist layer is transferred to the first hard mask layer and the poly-silicon layer. As a result, the poly gates 621, 622, 623, 624 and corresponding hard masks HM-1 over the top surfaces of the poly gates 621, 622, 623, 624 are formed, as illustrated in FIGS. 6A-I, 6A-II. Example materials of the hard masks HM-1 include, but are not limited to, silicon oxide, silicon nitride, silicon oxynitride, and/or other suitable dielectric materials. The hard mask layer is formed in one or more embodiments by a method such as chemical vapor deposition (CVD) or physical vapor deposition (PVD).

A plurality of spacers is formed over sidewalls of the corresponding poly gates 621, 622, 623, 624. In at least one embodiment, the spacers formed over the sidewalls of the poly gates 621, 622, 623, 624 correspond to the spacers 231-238 described with respect to FIGS. 2, 2A, 2B and 2C. A spacer 231 is designated in FIGS. 6A-I, 6A-II, for example. In one example, a dielectric layer is formed over the poly gates 621, 622, 623, 624 and the substrate 274, and covers sidewalls of the poly gates 621, 622, 623, 624. Example dielectric materials include, but are not limited to, silicon oxide, silicon nitride, and silicon oxy-nitride. The dielectric layer is formed by CVD, PVD, atomic layer deposition (ALD), or other suitable technique. An anisotropic etching is performed on the dielectric layer to form a pair of spacers on opposite sidewalls of the corresponding poly gates 621, 622, 623, 624.

As illustrated in FIG. 6A-II, source/drain (SD) regions are formed over the fins and between the facing spacers of the adjacent poly gates 621, 622, 623, 624. In one or more embodiments, portions of the fin 218 between the facing spacers of the adjacent poly gates 621, 622, 623, 624 are recessed to form S/D cavities having bottom surfaces lower than the top surface of the fin 218. For example, a biased etching process is performed to form the S/D cavities, using the hard masks HM-1 on top of the poly gates 621, 622, 623, 624 and the spacers as hard masks. After the formation of the S/D cavities, S/D regions are produced by epi-growing a strained material in the S/D cavities. In at least one embodiment, the lattice constant of the strained material is different from the lattice constant of the substrate 274. Thus, channel regions of the semiconductor device are strained or stressed to enhance carrier mobility of the device. For example, for a PMOS device, the strained material is configured to apply a compressive stress to enhance hole mobility in the at least one source or drain region of the PMOS device. For an NMOS device, the strained material is configured to apply a tensile stress to enhance electron mobility in the at least one source or drain region of the PMOS device. Examples of the strained material include, but are not limited to, SiGe, SiC, GeSn, SiGeSn, SiP and other suitable materials. In at least one embodiment, the strained material for a PMOS device comprises SiGe. In at least one embodiment, the strained material for an NMOS device comprises SiC. In some embodiments, the strained material comprises a dislocation. In some embodiments, a pre-cleaning process is performed to clean the S/D cavities with HF or other suitable solution. Then, the strained material, such as silicon germanium (SiGe) is selectively grown by an LPCVD process to fill the S/D cavities. In at least one embodiment, upper surfaces of the strained material are lower than the top surface of the fin 218. In one or more embodiments, the upper surfaces of the strained material extend upward above top surface of the fin 218, as illustrated in FIG. 6A-II.

An ILD layer 276 is deposited over the substrate 274 having the dummy gate electrodes, spacers, fins and S/D regions thereon. Example materials of the ILD layer 276 include, but are not limited to, silicon oxide, spin-on glass (SOG), fluorinated silica glass (FSG), carbon doped silicon oxide, other suitable dielectric materials, and/or combinations thereof. In some embodiments, the ILD layer 276 is formed by a high density plasma (HDP) process. A resulting structure 600A is obtained as illustrated in FIGS. 6A-I, 6A-II.

In some embodiments, the poly gates 621, 622, 623, 624 remain in the semiconductor device in a gate-first process. In some embodiments, the poly gates 621, 622, 623, 624 are removed and replaced with metal gate electrodes in a gate-last or gate replacement process.

A gate replacement process is described with respect to FIGS. 6B-I, 6B-II. In one or more embodiments, the ILD layer 276 is planarized by a chemical mechanical polishing (CMP) process to remove a thickness of the ILD layer 276 and the hard masks HM-1, and to expose top surfaces of the poly gates 621, 622, 623, 624. The poly gates 621, 622, 623, 624 are removed, for example, by a wet etch and/or a dry etch process, to form openings between corresponding pairs spacers. In at least one embodiment, the gate dielectric layers formed under the poly gates 621, 622, 623, 624 remain in the openings between corresponding pairs spacers, and conductive materials of the replacement gate electrodes are filled in the openings over the remaining gate dielectric layers. In at least one embodiment, the gate dielectric layers formed under the poly gates 621, 622, 623, 624 are removed and new gate dielectric layers are deposited in the openings between corresponding pairs spacers. In at least one embodiment, the new gate dielectric layers correspond to the gate dielectric layers 277, 278, 279, 280 described with respect to FIGS. 2A-2B. A gate dielectric layer 277 is designated in FIGS. 6B-I, for example.

In one or more embodiments, a conductive work function layer is formed over the gate dielectric layer. For example, a p-type work function metal (p-metal) comprises TiN, TaN and/or a carbon-doped metal nitride such as TaCN, whereas an n-type work function metal (n-metal) comprises Ta, TiAl, and/or TiAlN. In one or more embodiments, the work function layer comprises doped conducting oxide materials.

One or more second conductive materials are deposited over the work function layer to fill the openings between corresponding pairs spacers and obtain gate electrodes. Example materials of the second conductive materials include, but are not limited to, aluminum, copper, tungsten, metal alloys, metal silicide, other suitable materials, or combinations thereof. In at least one embodiment, the obtained gate electrodes correspond to the gate electrodes 221, 222, 223, 224 described with respect to FIGS. 2A-2B. A gate electrode 221 is designated in FIGS. 6B-I, for example.

Hard masks are formed over the gate electrodes to function as an etch mask, and/or to protect the underlying layers from damage during subsequent processing. In one or more embodiments, top portions of the gate electrodes are recessed by an etching process. A second hard mask layer is deposited over the resulting structure to fill in the recesses over the gate electrodes and between the corresponding pairs of spacers. Example materials of the second hard mask layer include, but are not limited to, silicon oxide, silicon nitride, silicon oxynitride, silicon carbide, or combinations thereof. In at least one embodiment, the second hard mask layer includes more than one layers of one or more of the listed hard mask materials. A CMP process is performed to obtain hard masks HM-2 (also referred to herein as "gate hard masks") over the gate electrodes. In at least one embodiment, a further dielectric layer is deposited over the hard masks HM-2 and remaining portions of the ILD layer 276, and a further CMP process is performed to planarize the deposited dielectric layer. The planarized dielectric layer and the underlying, remaining portions of the ILD layer 276 are referred to herein as an ILD-1 layer.

A contact patterning process is described with respect to FIGS. 6B-I to 6F-I, and 6B-II to 6F-II. As illustrated in FIGS. 6B-I, 6B-II, a third hard mask layer HM-3 is deposited over the ILD-1 layer. Example materials of the hard mask layer HM-3 include, but are not limited to, SiO2, SiON, Si3N4, poly-Si, amorphous-Si, carbon-containing dielectric, nitrogen-containing dielectric, organic and refractory metal. In at least one embodiment, the hard mask layer HM-3 includes a single layer of one of the listed hard mask materials. In at least one embodiment, the hard mask layer HM-3 includes more than one layers of one or more of the listed hard mask materials. A first photoresist layer PR-1 is deposited over the hard mask layer HM-3 by a suitable process, such as spin-on coating. The photoresist layer PR-1 is patterned to form an opening 642. The opening 642 corresponds to the first contact patterning region 242 described with respect to FIG. 2C. In at least one embodiment, the photoresist layer PR-1 comprises a positive photoresist, and is patterned by a clear tone mask. The opening 642 exposes a corresponding portion of the underlying hard mask layer HM-3. A resulting structure 600B is obtained as illustrated in FIGS. 6B-I, 6B-II.

As illustrated in FIGS. 6C-I, 6C-II, an etching process is performed to remove the portion of the hard mask layer HM-3 exposed by the opening 642. As result, a portion of the ILD-1 layer corresponding to the opening 642 is exposed. A resulting structure 600C is obtained as illustrated in FIGS. 6C-I, 6C-II.

As illustrated in FIGS. 6D-I, 6D-II, the photoresist layer PR-1 is stripped. A second photoresist layer PR-2 is deposited and patterned to form photoresist blocks 651, 652 which cover portions of the opening 642. The photoresist blocks 651, 652 correspond to the second contact patterning regions 251, 252 described with respect to FIG. 2C. In at least one embodiment, the photoresist layer PR-2 comprises a positive photoresist, and is patterned by a dark tone mask. A portion of the opening 642 not covered by the photoresist blocks 651, 652 is designated as an opening 653 in FIGS. 6C-I, 6C-II. A portion of the ILD-1 layer exposed by the opening 653 is removed, for example, by an etching process, to expose the underlying isolation structures 275 (FIG. 6D-I) and S/D regions (FIG. 6D-II). Portions of the hard masks HM-2 and the spacers are also exposed. For example, a portion 665 of a hard mask HM-2 and a portion 666 of a spacer are exposed in the etched opening 653, as illustrated in FIG. 6D-I, for example. The etching process uses the remaining portions of the hard mask layer HM-3 and the photoresist blocks 651, 652 of the photoresist layer PR-2 as an etching mask. A resulting structure 600D is obtained as illustrated in FIGS. 6D-I, 6D-II.

In some embodiments, silicide features are formed over the exposed S/D regions in the structure 600D, to reduce electrical resistance with subsequently formed contact plugs. Silicide features are formed, for example, by blanket depositing a metal layer, such as nickel, titanium, cobalt, and combinations thereof. The metal layer is annealed to cause the metal layer to react with silicon to form silicide. The un-reacted metal is selectively removed through the use of an etchant that attacks the metal material but does not attack silicide.

As illustrated in FIGS. 6E-I, 6E-II, the photoresist layer PR-2 is stripped. A conductive layer M-0 is deposited over the structure 600D to fill in the opening 653 and cover the exposed portions of the hard masks HM-2, spacers, isolation structures 275 and S/D regions. In at least one embodiment, the conductive layer M-0 includes a metal of the metal layer M0. In at least one embodiment, the conductive layer M-0 includes a multilayer structure. An example multilayer structure includes a TiN layer underlying a W layer. A resulting structure 600E is obtained as illustrated in FIGS. 6E-I, 6E-II.

As illustrated in FIGS. 6F-I, 6F-II, a CMP process is performed to remove the hard mask layer HM-3 and the conductive layer M-0 outside the spaces between the adjacent spacers. As a result a plurality of contact plugs, or SACs, 262, 263 and 265 are obtained. A further dielectric layer ILD-2 is deposited over the planarized structure. A resulting structure 600F is obtained as illustrated in FIGS. 6F-I, 6F-II.

In one or more embodiments, one or more butt contacts are formed in one or more processes separately from the SACs, as described with respect to FIG. 5A. For example, openings corresponding to butt contacts are formed, by an etching process, in the layer ILD-2 to expose corresponding gate electrodes and SACs. The etching process also removes the hard masks HM-2 over the gate electrodes over which butt contacts are to be formed. The openings corresponding to butt contacts are filled with one or more conductive materials to form the butt contacts.

In some embodiments, butt contacts are formed together with SACs as described with respect to FIG. 5B. For example, a separate etching process using a separate mask is performed to form additional openings in the ILD-1 layer in the structure 600D in FIGS. 6D-I, 6D-II. The additional openings expose one or more gate electrodes over which butt contacts are to be formed. In at least one embodiment, silicide features are formed over the exposed gate electrodes. When the conductive layer M-0 is deposited as described with respect to Figs. FIGS. 6E-I, 6E-II, the conductive layer M-0 also fills the additional openings for butt contacts. As a result, when the CMP process is performed as described with respect to FIGS. 6F-I, 6F-II, combined Butt_CO+SAC contacts are obtained together with the SACs, as described with respect to FIG. 5B.

In some embodiments, gate contacts are formed together with the butt contacts. For example, openings for gate contacts are formed together with openings for butt contacts, by etching through a thickness of the ILD-1 or ILD-2 layer and also removing hard masks HM-2 over the corresponding gate electrodes. When conductive materials are filled in the openings for butt contacts, the conductive materials also fill in the openings for gate contacts, to obtain the gate contacts together with the butt contacts. In at least one embodiment, when butt contacts are formed together with SACs, butt contacts, gate contacts and SACs are formed together. In at least one embodiment, when butt contacts are formed in one or more processes separately from SACs, butt contacts and gate contacts are formed together after the SACs as formed.

In some embodiments, the manufacturing processes described with respect to FIGS. 6A-I~6F-I, and FIGS. 6A-II~6F-II are applicable to manufacture memory devices or memory cells described with respect to FIGS. 4A-4F, and 5A-5B. For example, in at least one embodiment, to pattern the contact areas for a memory cell having the layout 400A described in FIG. 4, a first photolithography process using a first clear tone mask is performed to form a first opening corresponding to the first contact patterning region 441 of the first half-cell in the hard mask layer HM-3. A second photolithography process using a second clear tone mask is performed to form a second opening corresponding to the first contact patterning region 442 of the second half-cell in the hard mask layer HM-3. A third photolithography process using a dark tone mask is performed to form photoresist blocks corresponding to the second contact patterning regions 451, 452 in the corresponding first and second openings in the hard mask layer HM-3. The remaining portions of the hard mask layer HM-3 and the photoresist blocks are used as an etching mask to etch the ILD-1 layer to form the corresponding contact areas for SACs. In some embodiments, the first and second photolithography processes are combined in a common photolithography process using a clear tone mask corresponding to a combination of the first and second clear tone masks.

FIGS. 7A-7F are cross-section views of a semiconductor device taken along line I-I' in FIG. 2C, at various manufacturing stages of the semiconductor device, in accordance with some embodiments.

As illustrated in FIG. 7A, well regions, fins, S/D regions, isolation structures, gate electrodes, gate dielectric layers, spacers, gate hard masks, ILD-1 layer, hard mask layer HM-3, and photoresist layer PR-1 having the opening 642 corresponds to the first contact patterning region 242 described with respect to FIG. 2C are formed over a substrate a described with respect to FIGS. 6A-I, 6B-I. The hard mask layer HM-3 includes a plurality of layers of one or more hard mask materials, including, but not limited to, SiO2, SiON, Si3N4, poly-Si, amorphous-Si, carbon-containing dielectric, nitrogen-containing dielectric, organic and refractory metal. One or more lower layers of the hard mask layer HM-3 is/are designated as lower hard mask layer HM-31, and remaining one or more upper layers of the hard mask layer HM-3 is/are designated as upper hard mask layer HM-32. A portion of the upper hard mask layer HM-32 is exposed in the opening 642. A resulting structure 700A is obtained as illustrated in FIG. 7A.

As illustrated in FIG. 7B, an etching process is performed to remove the upper hard mask layer HM-32 exposed by the opening 642. As result, a portion of the lower hard mask layer HM-31 corresponding to the opening 642 is exposed. In at least one embodiment, the upper hard mask layer HM-32 and the lower hard mask layer HM-31 are configured, e.g., by selecting the material and/or number of hard mask layers, to have an etch selectivity sufficient to cause the etching of the upper hard mask layer HM-32 to stop when the lower hard mask layer HM-31 is exposed. A resulting structure 700B is obtained as illustrated in FIG. 7B.

As illustrated in FIG. 7C, a second photoresist layer PR-2 is deposited and patterned to form photoresist blocks 651, 652 which cover portions of the exposed lower hard mask layer HM-31 in the opening 642. The photoresist blocks 651, 652 correspond to the second contact patterning regions 251, 252 described with respect to FIG. 2C. A portion of the opening 642 not covered by the photoresist blocks 651, 652 is designated as an opening 653. A portion of the lower hard mask layer HM-31 remains exposed by the opening 653. A resulting structure 700C is obtained as illustrated in FIG. 7C.

As illustrated in FIG. 7D, the second photoresist layer PR-2 is stripped. The ILD-1 layer is etched using the remaining portions of the upper hard mask layer HM-32 and the lower hard mask layer HM-31 as an etching mask, to expose the underlying isolation structures 275 (FIG. 7D) and S/D regions (as described with respect to FIG. 6D-II). A resulting structure 700D is obtained as illustrated in FIG. 7D. Compared to the manufacturing processes described in accordance with some embodiments with respect to FIGS. 6D-I, 6D-II, the etching process in one or more embodiments described with respect to FIG. 7D uses various portions of hard mask layer HM-3, rather than photoresist blocks, as an etching mask for etching contact areas in the ILD-1 layer. As a result, an enhanced critical dimension (CD) adjustment is possible in one or more embodiments described with respect to FIG. 7D, compared to one or more embodiments described with respect to FIGS. 6D-I, 6D-II.

In some embodiments, silicide features are formed over the exposed S/D regions as described herein.

As illustrated in FIG. 7E, a conductive layer M-0 is deposited over the structure 700D to fill in the opening 653, as described herein. A resulting structure 700F is obtained as illustrated in FIG. 7F.

As illustrated in FIG. 7F, a CMP process is performed to remove the upper hard mask layer HM-32 and lower hard mask layer HM-31 and the conductive layer M-0 outside the spaces between the adjacent spacers. As a result, a plurality of contact plugs, or SACs, are obtained as described herein. A further dielectric layer ILD-2 is deposited over the planarized structure. A resulting structure 700F is obtained as illustrated in FIG. 7F.

In some embodiments, gate contacts and butt contacts are formed together with the SACs, or in one or more processes separately from the SACs as described herein. In some embodiments, the manufacturing processes described with respect to FIGS. 7A-7F are applicable to manufacture memory devices or memory cells described with respect to FIGS. 4A-4F, and 5A-5B, as described herein.

Figure 8:
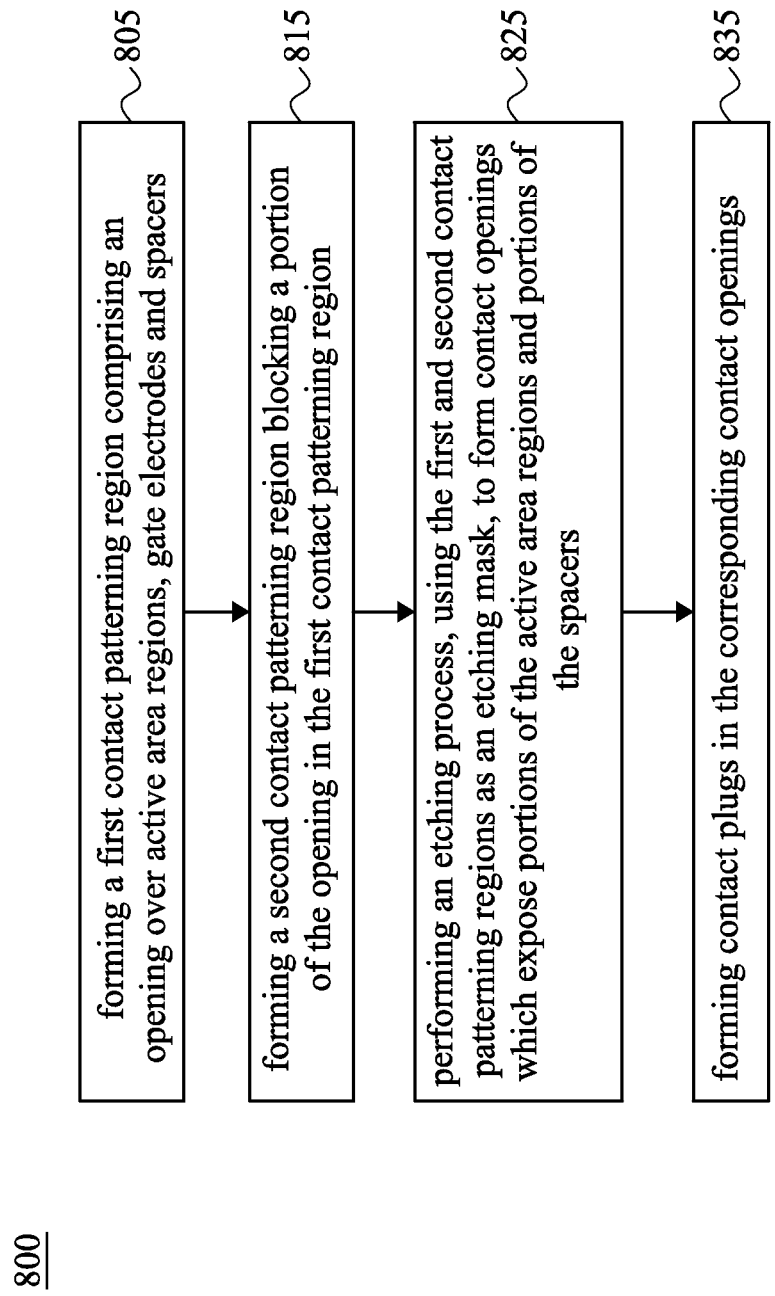
FIG. 8 is a flow chart of a method of manufacturing a semiconductor device, in accordance with some embodiments.

FIG. 8 is a flow chart of a method 800 of manufacturing a semiconductor device, in accordance with some embodiments.

At operation 805, a first contact patterning region comprising an opening is formed over active area regions, gate electrodes and spacers of a substrate. For example, as described with respect to FIGS. 6B-I, 6B-II, 6C-I, 6C-II, 7A and 7B, an opening 642 is formed over S/D regions, gate electrodes and spacers of a substrate 274.

At operation 815, a second contact patterning region is formed to block a portion of the opening in the first contact patterning region. For example, as described with respect to FIGS. 6D-I, and 7C, one or more portions of the opening 642 are blocked, leaving a smaller opening 653 corresponding to contact areas.

At operation 825, an etching process is performed using the first and second contact patterning regions as an etching mask, to form contact openings which expose portions of the active area regions and portions of the spacers. For example, as described with respect to FIGS. 6D-I, 6D-II, an ILD-1 layer is etched using the hard mask layer HM-3 corresponding to first contact patterning region 242 and the photoresist blocks 651, 652 corresponding to the second contact patterning regions 251, 252 as an etching mask. For another example, as described with respect to FIG. 7D, 6D-II, the ILD-1 layer is etched using the lower hard mask layer HM-31 corresponding to first contact patterning region 242 and the upper hard mask layer HM-32 corresponding to the second contact patterning regions 251, 252 as an etching mask. As a result, the S/D regions and corresponding spacers are exposed, as illustrated in FIG. 6D-II. In some embodiments, portions of one or more gate hard mask HM-2 are also exposed.

At operation 835, contact plugs are formed in the corresponding contact openings, for example, as described with respect to FIGS. 6E-I, 6E-II, 6F-I, 6F-II, 7E and 7F. The contact plugs are self-aligned contacts, or SACs, that fill the spaces between adjacent spacers over the corresponding S/D regions, and have boundaries defined by the boundaries of the corresponding spacers. In some embodiments, the boundaries of the SACs, which are formed over the exposed gate hard masks, are further defined by the boundaries of the gate electrodes corresponding to the gate hard masks.

Embodiments that combine different features and/or different embodiments are within the scope of the disclosure and will be apparent to those of ordinary skill in the art after reviewing various embodiments.

Some embodiments provide a patterning technique for forming contact areas over active area regions. The contact areas have boundaries defined by boundaries of a first contact patterning region (such as a clear tone patterning region), a second contact patterning region (such as a dark tone patterning region), and one or more spacers. As a result, the contact areas are self-aligned and fill the spaces between adjacent spacers. The described patterning technique in one or more embodiments increases landing areas for subsequent vias, and/or reduces contact resistance, and/or permits existing photolithography technique to be applicable to advanced manufacturing nodes. In some embodiments, the described patterning technique is applicable to manufacture of memory devices, such as FinFETs, with CD adjustment capability in one or more embodiments.

In some embodiments, a layout of a semiconductor device is stored on a non-transitory computer-readable medium. The layout comprises a plurality of active area regions, a plurality of gate electrodes crossing the plurality of active area regions, a plurality of spacers along sides of the corresponding plurality of gate electrodes, a first contact patterning region, a second contact patterning region, and a contact area. The first contact patterning region overlaps at least one active area region among the plurality of active area regions, at least one gate electrode among the plurality of gate electrodes, and at least one spacer among the plurality of spacers, the at least one spacer corresponding to the at least one gate electrode. The second contact patterning region overlaps a portion of the first contact patterning region. The contact area overlaps the at least one active area region. A boundary of the contact area is defined by boundaries of the first contact patterning region, the second contact patterning region and the at least one spacer.

In some embodiments, a layout of a memory device is stored on a non-transitory computer-readable medium. The layout comprises a plurality of memory cells. Each memory cell of the plurality of memory cells comprises first and second portions. Each portion of the first and second portions comprises a first transistor coupled between a first power supply node and a storage node, a second transistor coupled between a second power supply node and the storage node, a third transistor coupled between a bitline node and the storage node, a first contact patterning region, and a second contact patterning region. The first contact patterning region covers active area regions, gate electrodes and spacers of the first, second and third transistors. The second contact patterning region overlaps the first contact patterning region. The second contact patterning region is between the first power supply node and the second power supply node.

In a method of manufacturing a semiconductor device in accordance with some embodiments, a first contact patterning region is formed over a substrate, the first contact patterning region comprising an opening over active area regions, gate electrodes and spacers in the substrate. A second contact patterning region is formed over the substrate, the second contact patterning region blocking a portion of the opening in the first contact patterning region. An etching process using the first and second contact patterning regions as an etching mask is performed to form contact openings which expose portions of the active area regions and portions of the spacers. Contact plugs are formed in the corresponding contact openings and over the exposed portions of the active area regions and the exposed portions of the spacers.

The foregoing outlines features of several embodiments so that those of ordinary skill in the art may better understand the aspects of the present disclosure. Those of ordinary skill in the art should appreciate that they may readily use the present disclosure as a basis for designing or modifying other circuits, processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A layout of a semiconductor device, the layout stored on a non-transitory computer-readable medium and comprising:
   a plurality of active area regions;
   a plurality of gate electrodes crossing the plurality of active area regions;
   a plurality of spacers along sides of the corresponding plurality of gate electrodes;
   a first contact patterning region overlapping
      at least one active area region among the plurality of active area regions,
      at least one gate electrode among the plurality of gate electrodes, and
      at least one spacer among the plurality of spacers, the at least one spacer corresponding to the at least one gate electrode;
   a second contact patterning region overlapping a portion of the first contact patterning region; and
   a contact area overlapping the at least one active area region, a boundary of the contact area defined by boundaries of the first contact patterning region, the second contact patterning region and the at least one spacer.

2. The layout of claim 1, wherein
the boundary of the contact area is further defined by a boundary of the at least one gate electrode.

3. The layout of claim 1, wherein
the at least one gate electrode comprises adjacent first and second gate electrodes among the plurality of gate electrodes,
the at least one spacer comprises adjacent first and second spacers among the plurality of spacers, the first spacer corresponding to the first gate electrode, and the second spacer corresponding to the second gate electrode, and
the contact area comprises first through fourth edges, the first edge opposite the second edge, the third edge opposite the fourth edge,
   the first edge corresponding to an edge of the first spacer,
   the second edge corresponding to an edge of the second spacer,
   the third edge corresponding to an edge of the first contact patterning region, and
   the fourth edge corresponding to an edge of the second contact patterning region.

4. The layout of claim 1, further comprising:
a further contact area overlapping the at least one active area region,
wherein
the plurality of gate electrodes comprises adjacent first and second gate electrodes,
the plurality of spacers comprises adjacent first and second spacers, the first spacer corresponding to the first gate electrode, and the second spacer corresponding to the second gate electrode, and
the further contact area comprises first through fourth edges, the first edge opposite the second edge, the third edge opposite the fourth edge,
   the first edge corresponding to an edge of the first spacer,
   the second edge corresponding to an edge of the second spacer, and
   the third and fourth edges corresponding to opposite edges of the first contact patterning region.

5. The layout of claim 1, wherein
the first contact patterning region is configured to form an opening in a first photoresist layer, and
the second contact patterning region is configured to form a region filled with a photoresist material in a second photoresist layer.

6. The layout of claim 1, wherein
the first contact patterning region comprises a clear tone pattern, and
the second contact patterning region comprises a dark tone pattern.

7. The layout of claim 1, wherein
the at least one active area region comprises adjacent first and second active area regions among the plurality of active area regions,
the at least one gate electrode comprises first, second and third gate electrodes among the plurality of gate electrodes, the second gate electrode adjacent and between the first and third gate electrodes,
the at least one spacer comprises first through fourth spacers among the plurality of spacers, the first spacer corresponding to the first gate electrode, the second and third spacers corresponding to the second gate electrode, the fourth spacer corresponding to the third gate electrode, the first spacer facing the second spacer, the third spacer facing the fourth spacer, and the contact area is a first contact area overlapping the first active area region, the first contact area comprising first through fourth edges, the first edge opposite the second edge, the third edge opposite the fourth edge,
- the first edge corresponding to an edge of the first spacer,
- the second edge corresponding to an edge of the second spacer,
- the third edge corresponding to a first edge of the first contact patterning region, and
- the fourth edge corresponding to a first edge of the second contact patterning region.

8. The layout of claim 7, further comprising:
a second contact area overlapping the second active area region, the second contact area comprising first through fourth edges, the first edge of the second contact area opposite the second edge of the second contact area, the third edge of the second contact area opposite the fourth edge of the second contact area,
- the first edge of the second contact area corresponding to the edge of the first spacer,
- the second edge of the second contact area corresponding to the edge of the second spacer,
- the third edge of the second contact area corresponding to a second edge of the first contact patterning region, and
- the fourth edge of the second contact area corresponding to a second edge of the second contact patterning region.

9. The layout of claim 8, further comprising:
a third contact area overlapping the first and second active area regions, the third contact area comprising first through fourth edges, the first edge of the third contact area opposite the second edge of the third contact area, the third edge of the third contact area opposite the fourth edge of the third contact area,
- the first edge of the third contact area corresponding to an edge of the third spacer,
- the second edge of the third contact area corresponding to an edge of the fourth spacer,
- the third edge of the third contact area corresponding to the first edge of the first contact patterning region, and
- the fourth edge of the third contact area corresponding to the second edge of the first contact patterning region.

10. The layout of claim 9, wherein
the second gate electrode and the first active area region define a first transistor,
the second gate electrode and the second active area region define a second transistor, and
the third contact area coupling a source or a drain of the first transistor with a source or a drain of the second transistor.

11. A layout of a memory device, the layout stored on a non-transitory computer-readable medium and comprising:
a plurality of memory cells, each memory cell of the plurality of memory cells comprising first and second portions, each portion of the first and second portions comprising:
- a first transistor coupled between a first power supply node and a storage node;
- a second transistor coupled between a second power supply node and the storage node;
- a third transistor coupled between a bitline node and the storage node;
- a first contact patterning region covering active area regions, gate electrodes and spacers of the first, second and third transistors, the first contact patterning region covering less than an entirety of the each portion; and
- a second contact patterning region overlapping the first contact patterning region, the second contact patterning region being between the first power supply node and the second power supply node.

12. The layout of claim 11, wherein
the first contact patterning region comprises a clear tone pattern, and
the second contact patterning region comprises a dark tone pattern.

13. The layout of claim 11, wherein, in each portion of the first and second portions,
the active area regions comprise a first active area region of the first and third transistors, and a second active area region of the second transistor,
the gate electrodes comprise a first gate electrode of the first and second transistors, and a second gate electrode of the third transistor,
the spacers comprise first and second spacers on opposite sides of the first gate electrode, and third and fourth spacers on opposite sides of the second gate electrode.

14. The layout of claim 13, wherein, in each portion of the first and second portions,
edges of the first power supply node are defined by corresponding edges of the first contact patterning region, the second contact patterning region and the first spacer,
edges of the second power supply node are defined by corresponding edges of the first contact patterning region, the second contact patterning region and the first spacer, and
edges of the storage node are defined by corresponding edges of the first contact patterning region, the second spacer and the third spacer.

15. The layout of claim 13, wherein, in each portion of the first and second portions,
edges of the bitline node are defined by corresponding edges of the first contact patterning region and the fourth spacer.

16. The layout of claim 13, wherein each portion of the first and second portions further comprises:
a third contact patterning region overlapping the first contact patterning region, wherein edges of the bitline node are defined by corresponding edges of the first contact patterning region, the third contact patterning region and the fourth spacer.

17. The layout of claim 13, wherein each memory cell of the plurality of memory cells further comprises:
a contact area coupling the storage node of one of the first and second portions to the first gate electrode of the other of the first and second portions.

18. A layout of a semiconductor device, the layout stored on a non-transitory computer-readable medium and comprising:
a first active area region;
a second active area region;
a first gate electrode crossing the first active area region and the second active area region;

a second gate electrode crossing the first active area region and the second active area region;

a first spacer along a side of the first gate electrode;

a second spacer along a side of the second gate electrode;

a first contact patterning region overlapping the first active area region, the second active area region, the first gate electrode, the second gate electrode, the first spacer, and the second spacer;

a second contact patterning region overlapping a portion of the first contact patterning region;

a first contact area overlapping the first active area region; and a second contact area overlapping the second active area region, wherein each of the first contact area and the second contact area has a boundary defined by boundaries of the first contact patterning region, the second contact patterning region, the first spacer, and the second spacer.

19. The layout of claim 18, wherein each of the first active area region and the second active area comprises a fin.

20. The layout of claim 18, wherein the first contact patterning region comprises a clear tone pattern, and the second contact patterning region comprises a dark tone pattern.

* * * * *